(12) United States Patent
Hahn et al.

(10) Patent No.: US 11,329,616 B2
(45) Date of Patent: *May 10, 2022

(54) SYSTEMS AND METHODS FOR SPLIT-FREQUENCY AMPLIFICATION

(71) Applicant: Kumu Networks, Inc., Sunnyvale, CA (US)

(72) Inventors: Wilhelm Steffen Hahn, Sunnyvale, CA (US); Ernest Landi, Sunnyvale, CA (US)

(73) Assignee: Kumu Networks, Inc., Sunnyvale, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 17/181,060

(22) Filed: Feb. 22, 2021

(65) Prior Publication Data
US 2021/0175863 A1 Jun. 10, 2021

Related U.S. Application Data

(63) Continuation of application No. 17/011,524, filed on Sep. 3, 2020, now Pat. No. 10,965,260.

(Continued)

(51) Int. Cl.
*H03F 3/193* (2006.01)
*H03B 5/12* (2006.01)
*H03D 7/12* (2006.01)

(52) U.S. Cl.
CPC ......... *H03F 3/1935* (2013.01); *H03B 5/1212* (2013.01); *H03D 7/12* (2013.01);
(Continued)

(58) Field of Classification Search
CPC ....................................................... H03F 3/1935
(Continued)

(56) References Cited

U.S. PATENT DOCUMENTS

| | | | | |
|---|---|---|---|---|
| 4,602,221 A | * | 7/1986 | Regan | H03F 1/0283 331/117 FE |
| 7,928,801 B1 | | 4/2011 | Lam et al. | |

(Continued)

OTHER PUBLICATIONS

International Search Report and Written Opinion for application No. PCT/US2020/049182, dated Feb. 16, 2021.

(Continued)

*Primary Examiner* — Joseph Chang
(74) *Attorney, Agent, or Firm* — Jeffrey Schox; Samuel Rosenthal

(57) ABSTRACT

A system for split-frequency amplification, preferably including: one or more primary-band amplification stages, one or more secondary-band amplification stages, one or more band-splitting filters, and/or one or more signal couplers. An analog canceller including one or more split-frequency amplifiers. A mixer including one or more split-frequency amplifiers. A voltage-controlled oscillator including one or more split-frequency amplifiers. A method for split-frequency amplification, preferably including: receiving an input signal, separating the input signal into signal portions, and/or amplifying the signal portions, and optionally including combining the amplified signal portions and/or providing one or more output signals.

21 Claims, 18 Drawing Sheets

Related U.S. Application Data

(60) Provisional application No. 62/897,137, filed on Sep. 6, 2019.

(52) U.S. Cl.
CPC .. *H03F 2200/165* (2013.01); *H03F 2200/171* (2013.01); *H03F 2200/451* (2013.01)

(58) Field of Classification Search
USPC ...................................................... 331/117 R
See application file for complete search history.

(56) References Cited

U.S. PATENT DOCUMENTS 10,965,260 B1 * 3/2021 Hahn ................... H03F 3/1935
2006/0262880 A1 11/2006 Mizuta et al.
2010/0166109 A1 7/2010 Neumann et al.
2015/0295552 A1 10/2015 Abou-Chahine et al.
2016/0111768 A1 4/2016 Martineau et al.
2017/0133985 A1 5/2017 Watkins
2017/0195015 A1 7/2017 Schmid et al.
2017/0317711 A1 11/2017 Jian et al.
2019/0158193 A1 5/2019 Jain et al.

OTHER PUBLICATIONS

Watkins, G.T., et al., "Split frequency high-voltage driver for dynamic load modulated RF amplifiers", IEEE, Feb. 4, 2016, https://ieeexplore.ieee.org/stamp/stamp.jsp?tp=&arnumber=7396043.

* cited by examiner

SYSTEMS AND METHODS FOR SPLIT-FREQUENCY AMPLIFICATION

CROSS-REFERENCE TO RELATED APPLICATIONS

This application is a continuation of U.S. application Ser. No. 17/011,524, filed 3 Sep. 2020, which claims the benefit of U.S. Provisional Application Ser. No. 62/897,137, filed on 6 Sep. 2019, each of which is incorporated in its entirety by this reference.

TECHNICAL FIELD

This invention relates generally to the analog circuit field, and more specifically to new and useful systems and methods for split-frequency amplification.

BACKGROUND

Many traditional wireless communication systems are half-duplex; that is, they are not capable of transmitting and receiving signals simultaneously on a single wireless communications channel. Recent work in the wireless communications field has led to advancements in developing full-duplex wireless communications systems; these systems, if implemented successfully, could provide enormous benefit to the wireless communications field. For example, the use of full-duplex communications by cellular networks could cut spectrum needs in half. One major roadblock to successful implementation of full-duplex communications is the problem of self-interference.

Many solutions to address self-interference rely on amplifiers (e.g., as part of an analog self-interference canceller, a mixer, and/or an oscillator), but these solutions may suffer in performance due to constraints inherent in traditional amplification solutions. Thus, there is a need in the wireless communications field to create new and useful systems for split-frequency amplification.

DESCRIPTION OF THE PREFERRED EMBODIMENTS

Figure 1A:
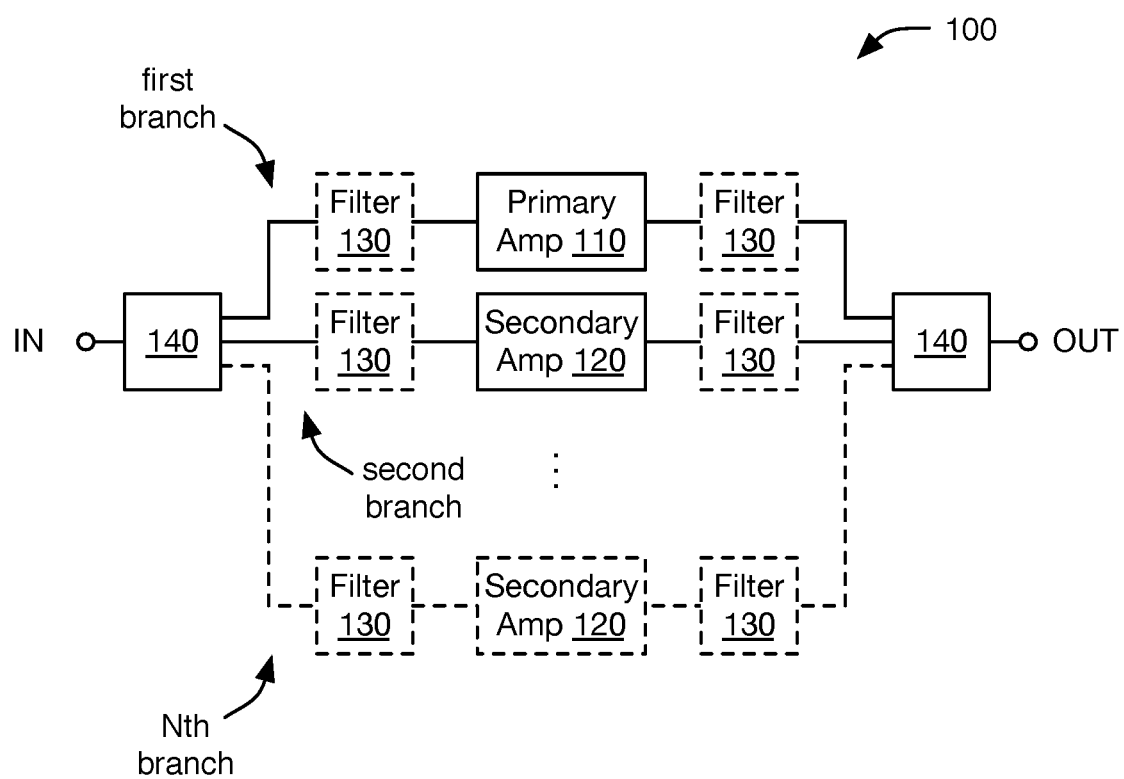
FIGS. 1A-1B are diagram views of a system of a first and second invention embodiment, respectively.

The following description of the preferred embodiments of the invention is not intended to limit the invention to these preferred embodiments, but rather to enable any person skilled in the art to make and use this invention.

1. Full-Duplex Wireless Communication Systems

Wireless communications systems have revolutionized the way the world communicates, and the rapid growth of communication using such systems has provided increased economic and educational opportunity across all regions and industries. Unfortunately, the wireless spectrum required for communication is a finite resource, and the rapid growth in wireless communications has also made the availability of this resource ever scarcer. As a result, spectral efficiency has become increasingly important to wireless communications systems.

One promising solution for increasing spectral efficiency is found in full-duplex wireless communications systems; that is, wireless communications systems that are able to transmit and receive wireless signals at the same time on the same wireless channel. This technology allows for a doubling of spectral efficiency compared to standard half-duplex wireless communications systems.

While full-duplex wireless communications systems have substantial value to the wireless communications field, such systems have been known to face challenges due to self-interference; because reception and transmission occur at the same time on the same channel, the received signal at a full-duplex transceiver may include undesired signal components from the signal being transmitted from that transceiver. As a result, full-duplex wireless communications systems often include analog and/or digital self-interference cancellation circuits to reduce self-interference (e.g., as described in U.S. patent application Ser. No. 14/728,501, filed 2 Jun. 2015, and/or in U.S. patent application Ser. No. 16/808,624, filed 4 Mar. 2020, each of which is herein incorporated in its entirety by this reference).

Full-duplex transceivers preferably sample transmission output as baseband digital signals, intermediate frequency (IF) analog signals, or as radio-frequency (RF) analog signals, but full-duplex transceivers may additionally or alternatively sample transmission output in any suitable manner (e.g., as IF digital signals). This sampled transmission output may be used by full-duplex transceivers to remove interference from received wireless communications data (e.g., as RF/IF analog signals or baseband digital signals). In many full-duplex transceivers, an analog self-interference cancellation system is paired with a digital self-interference cancellation system. The analog self-interference cancellation system removes a first portion of self-interference by summing delayed, phase shifted and scaled versions of the RF transmit signal to create an RF self-interference cancellation signal, which is then subtracted from the RF receive signal. Alternatively, the analog cancellation system may perform similar tasks at an intermediate frequency. After the RF (or IF) receive signal has the RF/IF self-interference cancellation signal subtracted, it passes through an analog-to-digital converter of the receiver (and becomes a digital receive signal). After this stage, a digital self-interference cancellation signal (created by transforming a digital transmit signal) is then subtracted from the digital receive signal.

The systems and methods described herein may increase performance of full-duplex transceivers (and other applicable systems) by enabling split-frequency amplification. Other applicable systems include active sensing systems (e.g., RADAR), wired communications systems, wireless communications systems, channel emulators, reflectometers, PIM analyzers and/or any other systems featuring analog electronics, including communication systems where transmit and receive bands are close in frequency (preferably non-overlapping bands, but additionally or alternatively overlapping bands).

2. System for Split-Frequency Amplification

2.1 Overview

Figure 1B:
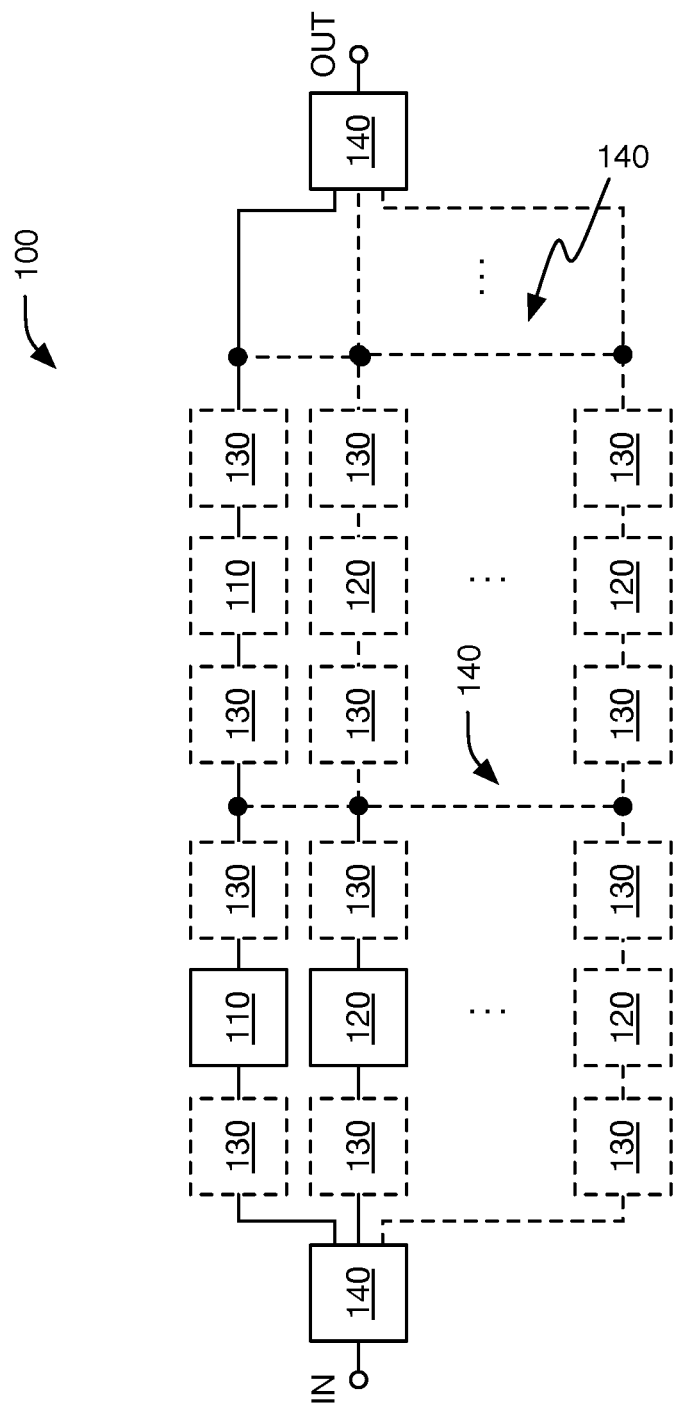

A system 100 for split-frequency amplification preferably includes a primary-band amplification stage 110 (or multiple primary-band amplification stages 110a, 11b, etc.), one or more secondary-band amplification stages 120 (e.g., multiple secondary-band amplification stages 120a, 120b, etc.), one or more band-splitting filters 130, and/or one or more signal couplers 140, such as shown by way of examples in FIGS. 1A-1B.

The system 100 preferably operates by amplifying an input signal using a plurality of parallel amplification paths, each preferably exhibiting different spectral characteristics (e.g., different gain and/or noise characteristics as a function of frequency). For example, the system can operate by separating the input signal into a primary frequency band and one or more secondary frequency bands (though these bands may of course overlap). In some variants, this frequency separation approach can exhibit one or more advantages, such as arising due to differences in how various amplification solutions perform in one frequency band versus another. For example (e.g., as shown by way of examples in FIGS. 2A-2C), a BJT-based amplifier (including one or more bipolar junction transistors) may offer high gain and low noise (e.g., low noise power), but only at lower frequencies (e.g., wherein gain decreases significantly above a threshold roll-off frequency); whereas a MOSFET-based amplifier (or amplifier based on any other suitable insulated-gate field-effect transistors) may offer a larger range of operation (e.g., by having substantially flat gain over a larger bandwidth), but worse noise performance at lower frequencies (e.g., frequencies below the BJT-based amplifier roll-off frequency). In some examples, the high-frequency gain (e.g., for some frequencies above the roll-off frequency) of the BJT-based amplifier can be substantially less than its low-frequency gain (e.g., below the roll-off frequency) and/or than the MOSFET-based amplifier's high-frequency gain, such as being lesser by at least 10 dB, 20 dB, 30 dB, 6-30 dB, 25-50 dB, or more than 50 dB. In this case, an implementation of the system 100 may function, for example, by splitting the input signals into two frequency bands (e.g., as shown by way of examples in FIGS. 2A-2C), passing the low-frequency band (Band 1) to the BJT-based amplifier, and passing the high-frequency band (Band 2) to the MOSFET-based amplifier. The resulting outputs can be recombined (e.g., resulting in the output characteristics as shown in FIGS. 3A-3C, respectively). In some examples (e.g., in which the system includes a multi-chip module and/or discrete components), some or all amplifier paths can be implemented in different technologies (e.g., in different substrate materials, fabricated using different integrated circuit fabrication technologies, etc.); in a specific example, a silicon bipolar NPN path is matched with a GaAs MESFET and/or a standard NMOS path. In other examples, multiple amplifier paths of different kinds (e.g., both MOS- and BJT-based amplifier paths) can be implemented in a single technology; in a first specific example, both MOS- and BJT-based amplifier paths are implemented in a BiCMOS technology, whereas in a second specific example, both MOS- and BJT-based amplifier paths are implemented in an MOS (e.g., CMOS) technology (e.g., in which the BJT devices are not certified). In the example depicted in FIG. 2C, the current through the BJT-based amplifier is preferably substantially less than the current through the MOSFET-based amplifier (e.g., less by a factor of at least 2, 3, 5, 10, 20, 50, 100, 1000, etc.); however, the currents can additionally or alternatively have any other suitable values relative to each other.

While the frequency bands as shown in FIGS. 2A-C and 3A-C are non-overlapping, a person of skill in the art will recognize that the frequency bands of the system 100 may share any relation to each other. In examples, frequency bands may be non-overlapping but adjacent (e.g., Band 1: 0 to 2 MHz, Band 2: 2 MHz to 10 MHz, Band 3: 10 MHz and up); frequency bands may be non-overlapping and non-adjacent (e.g., Band 1: 0 to 2 MHz, Band 2: 10 MHz and up); frequency bands may be overlapping (e.g., Band 1: 0 to 2 MHz, Band 2: 1 MHZ to 10 MHz); frequency bands may be subsets of other bands (e.g., Band 1: 0 to 2 MHz, Band 2: all frequencies (i.e., 0 Hz and up)); and/or frequency bands may exhibit any suitable combination of such relationships (e.g., Band 1 non-overlapping and non-adjacent to any other band, Band 2 non-overlapping but adjacent to Band 4, Band 3 overlapping both Bands 2 and 3, and/or Band 5 as a strict subset of Band 4 and overlapping no other band, etc.).

Note that while the terminology of the present application refers to a primary-band amplification stage and one or more secondary-band amplification stages, this naming convention serves only to highlight that the system includes at least two distinct-frequency-band amplification stages (i.e., "primary" does not imply any sort of preference or performance advantage over "secondary"). Likewise, while there may be multiple secondary-band stages, it is understood that there may likewise be more than one secondary frequency band. And finally, it is understood that while the system 100 includes at least one primary-band amplification stage and at least one secondary-band amplification stage, it may additionally or alternatively include more than one amplification stage per frequency band.

2.2 Amplification Stages

The primary-band amplification stage 110 preferably functions to amplify a signal in a first frequency band of interest (e.g., as described above in more detail). The primary-band amplification stage 110 may include power amplifiers, operational amplifiers (op-amps), distributed amplifiers, switched mode amplifiers, fully-differential amplifiers, and/or any other suitable amplifiers. Amplifiers may include transistors (e.g., bipolar junction transistors (BJTs), field-effect transistors (FETs) such as junction gate FETs (JFETs) and/or metal-oxide-semiconductor FETs (MOSFETs), etc.), vacuum tubes (e.g., triodes, tetrodes, pentodes, etc.), and/or any other suitable active devices. The amplifiers may include single-ended and/or differential inputs and outputs, and/or can use any other type of signaling. A person of skill in the art will understand that, although an amplifier (or amplifier stage), signal path, and/or other elements of the system may be described and/or depicted herein as having a single-ended input and/or output, the input and/or output can alternatively be differential (e.g., wherein each filter or coupler on a single-ended path can be replaced by an analogous pair of filters or couplers, one on each side of the differential path), and/or vice versa (e.g., with analogous de-duplication of filters and couplers). In one example of the system, all amplifier stages are differential. However, the system can additionally or alternatively include any other suitable input and/or output types.

The primary-band amplification stage 110 may additionally or alternatively include circuitry to perform attenuation, phase inversion, phase shifting, time delay, impedance matching, transformers, and/or any other circuitry required to transform an input and/or output signal in a desired manner.

The secondary-band amplification stage 120 can include any suitable elements such as described above regarding the primary-band amplification stage (e.g., can include any suitable amplifiers such as those of the types described above, can include circuitry to perform signal transformations such as those of the types described above, etc.). The secondary-band amplification stage is preferably substantially similar to the primary-band amplification stage, except for the frequency band of operation (though, of course, in a given implementation, primary-band and secondary-band amplification stages may be configured differently, such as described below in more detail). For example, if the primary band is a lower-frequency band and the secondary band is a higher-frequency band, the primary-band amplification stage may include a BJT-based amplifier and the secondary-band amplification stage may include a FET-based amplifier.

In some embodiments, one or more of the amplification stages (e.g., primary and/or secondary stages) can each include multiple substages (preferably connected in series, but additionally or alternatively in parallel). For example, an input substage (e.g., CMOS-based telescopic amp, BJT-based amp, etc.) can be followed by a current mirror substage (e.g., as shown in FIGS. 7B-7C). The substages of an amplification stage can include transistors (and/or other active devices) or the same or different types.

The system can include one or more primary-band amplification stages 110 of the same or different types (e.g., a single primary-band amplification stage 110; multiple substantially identical primary-band amplification stages 110; multiple primary-band amplification stages 110, some or all of which substantially differ from each other, such as relying on different transistor technologies; etc.), and/or can include one or more secondary-band amplification stages 120 of the same or different types (e.g., a single secondary-band amplification stage 120; multiple substantially identical secondary-band amplification stages 120; multiple secondary-band amplification stages 120, some or all of which substantially differ from each other, such as relying on different transistor technologies; etc.). A person of skill in the art will understand that, although the FIGURES may depict multiple elements with identical labels (e.g., "Primary Amp 110", "Secondary Amp 120", etc.), such elements (within a single figure and/or between multiple figures) may or may not be identical to one another (e.g., one may be a BJT-based amplifier, whereas another may be an MOS-based amplifier). However, the primary- and secondary-band amplification stages can additionally or alternatively include any other suitable elements in any suitable configuration.

2.3 Band-Splitting Filters

Band-splitting filters 130 preferably function to aid in the separation (in some cases, along with signal couplers 140 of input signals to the system 100 in frequency. The term "band-splitting" is not intended to identify a specific type of filter, but rather indicates that the filters 130 function to aid in separating an input signal into frequency bands of interest, as previously described.

Band-splitting filters 130 are preferably low-pass or high-pass filters, but may additionally or alternative include bandpass filters and/or any other suitable filters. The filters 130 are preferably passive filters, but may additionally or alternatively include active filters. Filters 130 are preferably implemented with analog circuit components, but may additionally or alternatively be digitally implemented.

In variations of an invention embodiment in which band splitting filters 130 are frequency-tunable (e.g., by cut-off frequency, center frequency, etc.), said frequencies are preferably controlled by a control circuit or tuning circuit, but may additionally or alternatively be controlled by any suitable system (including manually controlled, e.g. as in a mechanically tuned capacitor). Each tunable filter preferably has a set quality (Q) factor, but may additionally or alternatively have a variable Q factor. Filters 130 may have different Q factors; for example, some of the tunable filters may be high-Q, some may be low-Q, and some may be no-Q (flat response).

The system can include one or more band-splitting filters 130 of the same or different types (e.g., high-pass, low-pass, band-pass, etc.) and/or having the same or different characteristics (e.g., cutoff frequency, slope, etc.). A person of skill in the art will understand that, although the FIGURES may depict multiple elements with identical labels (e.g., "Filter 130", "LPF", "HPF", etc.), such elements (within a single figure and/or between multiple figures) may or may not be identical to one another (e.g., one may be a high-pass filter, whereas another may be low-pass filter; one low-pass filter may have a low cutoff frequency, whereas another low-pass filter may have a higher cutoff frequency; etc.). However, the system can additionally or alternatively include any other suitable filters.

2.4 Signal Couplers

Signal couplers 140 function to allow analog signals to be split and/or combined. Signal couplers 140 may couple and/or split signals using varying amounts of power; for example, a signal coupler 140 intended to sample a signal may have an input port, an output port, and a sample port, and the coupler 140 may route the majority of power from the input port to the output port with a small amount coming from the sample port (e.g., a 99.9%/0.1% power split between the output and sample port, or any other suitable split).

The signal coupler 140 is preferably a summing gain stage, but can additionally or alternatively include a short section directional transmission line coupler, any power divider, power combiner, directional coupler, and/or other type of signal splitter. In some embodiments (e.g., configured for higher-frequency applications), the signal coupler 140 is preferably a passive coupler, but may additionally or alternatively be an active coupler (for instance, including gain blocks and power amplifiers). For example, the signal coupler 140 may comprise a coupled transmission line coupler, a branch-line coupler, a Lange coupler, a Wilkinson power divider, a hybrid coupler, a hybrid ring coupler, a multiple output divider, a waveguide directional coupler, a waveguide power coupler, a hybrid transformer coupler, a cross-connected transformer coupler, a resistive tee, and/or a resistive bridge hybrid coupler.

3. Architectures

3.1 Parallel Amplifier Stage Architectures

As mentioned in earlier sections, one advantage to split amplification is that it may be easier, less costly, and/or more efficient to meet some set of design criteria using a set of split-frequency amplification stages, rather than using one or more amplifiers operating in a single band.

Figure 4:
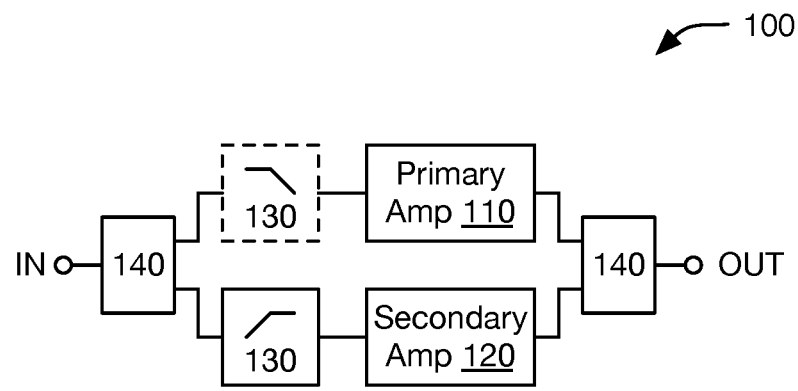
FIG. 4 is a diagram view of a system of an invention embodiment.

For example, a first implementation of an invention embodiment is as shown in FIG. 4. In this implementation, the input signal is split into primary and secondary signal paths. The primary signal path is low-pass filtered, while the secondary path is high-pass filtered. Such an implementation could enable, for example, the use of a BJT-based amplification stage in the low-pass filtered regime (taking advantage of low cost, high stability, and low noise power for BJTs operating in this frequency range), and a MOSFET-based amplification stage in the high-pass filtered regime (taking advantage of larger bandwidth and lower noise operating in the higher-frequency range). As another example, a JFET-based amplifier may be used in place of the BJT stage (while the JFET-based solution may have higher flicker noise and lower transconductance, it may still be superior to MOSFETs).

While this example shows two filters, it is notable that filtering may not be necessary for a given signal path. In some variations, the system may rely on the inherent frequency response of the primary-channel amplifier (e.g., which will typically roll off at higher frequencies), rather than (or in addition to) using a low-pass filter, in order to achieve the desired result in which the majority of the higher-frequency signal is handled by the secondary signal path (e.g., thus reducing high-frequency noise from the primary channel amplifier). In examples in which the amplifier includes both a BJT-based amplification stage (e.g., primary amplification stage 110) and a MOSFET-based amplification stage (e.g., secondary amplification stage 120), the transition frequency $f_T$ (e.g., the frequency at which the small-signal short-circuit current gain of a transistor is unity) of the BJTs is preferably substantially less than that of the MOSFETs, with the BJTs preferably rolling off at frequencies substantially lower than the maximum signal frequency, thus enabling omission of low-pass filters in the BJT-based amplifier path. In contrast, the amplifier preferably includes one or more high-pass filters in the MOSFET-based amplifier path, in order to minimize the amount of low-frequency noise introduced by the MOSFET-based amplification stage.

Figure 5A:
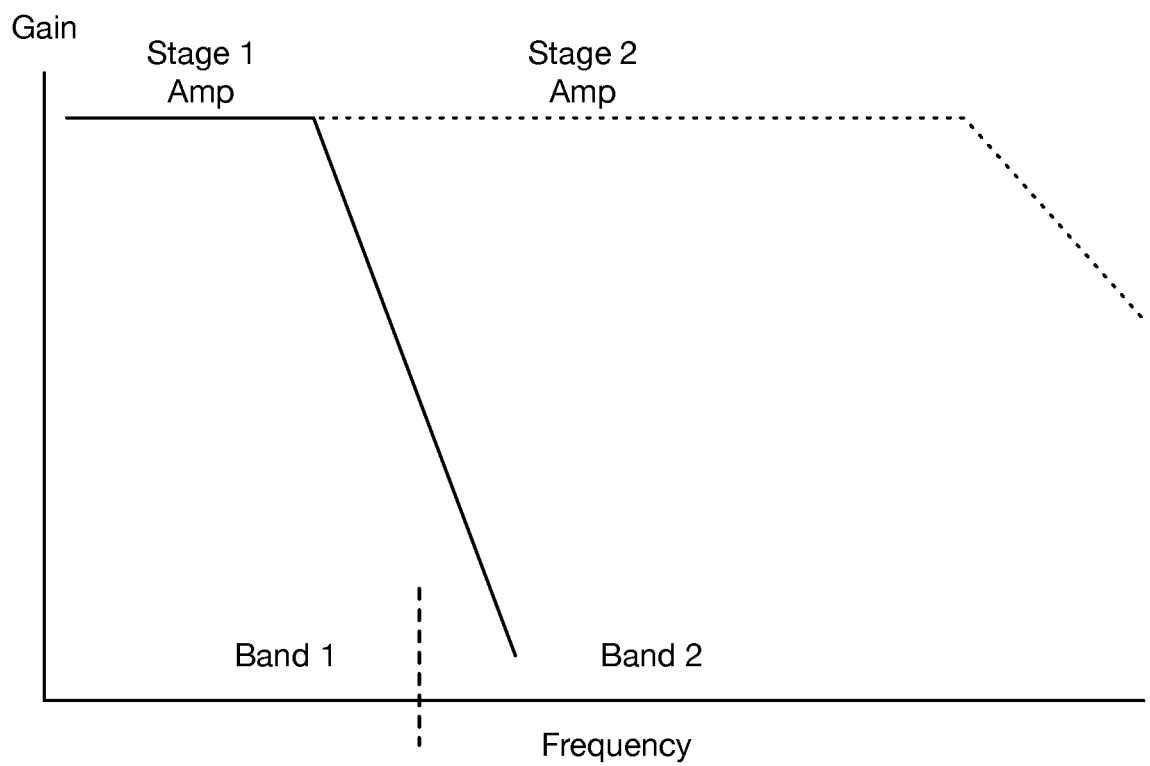
FIG. 5A is an example graph view of system output characteristics.
Figure 5B:
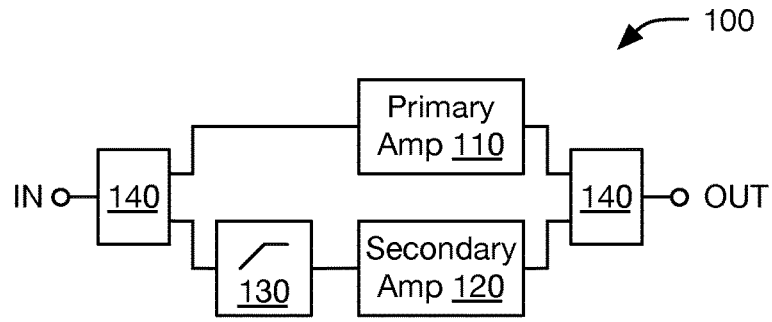
FIG. 5B is a diagram view of a system of an invention embodiment.

For example, consider an implementation in which the response of the primary and secondary amplification stages in each frequency band is as shown in FIG. 5A. Note that in the second band, the gain of stage 1 is so low that there is no need for a low-pass filter (i.e., the response of the amplification stage itself functions as a low-pass filter), thus enabling architectures such as the one shown in FIG. 5B.

Figure 5C:
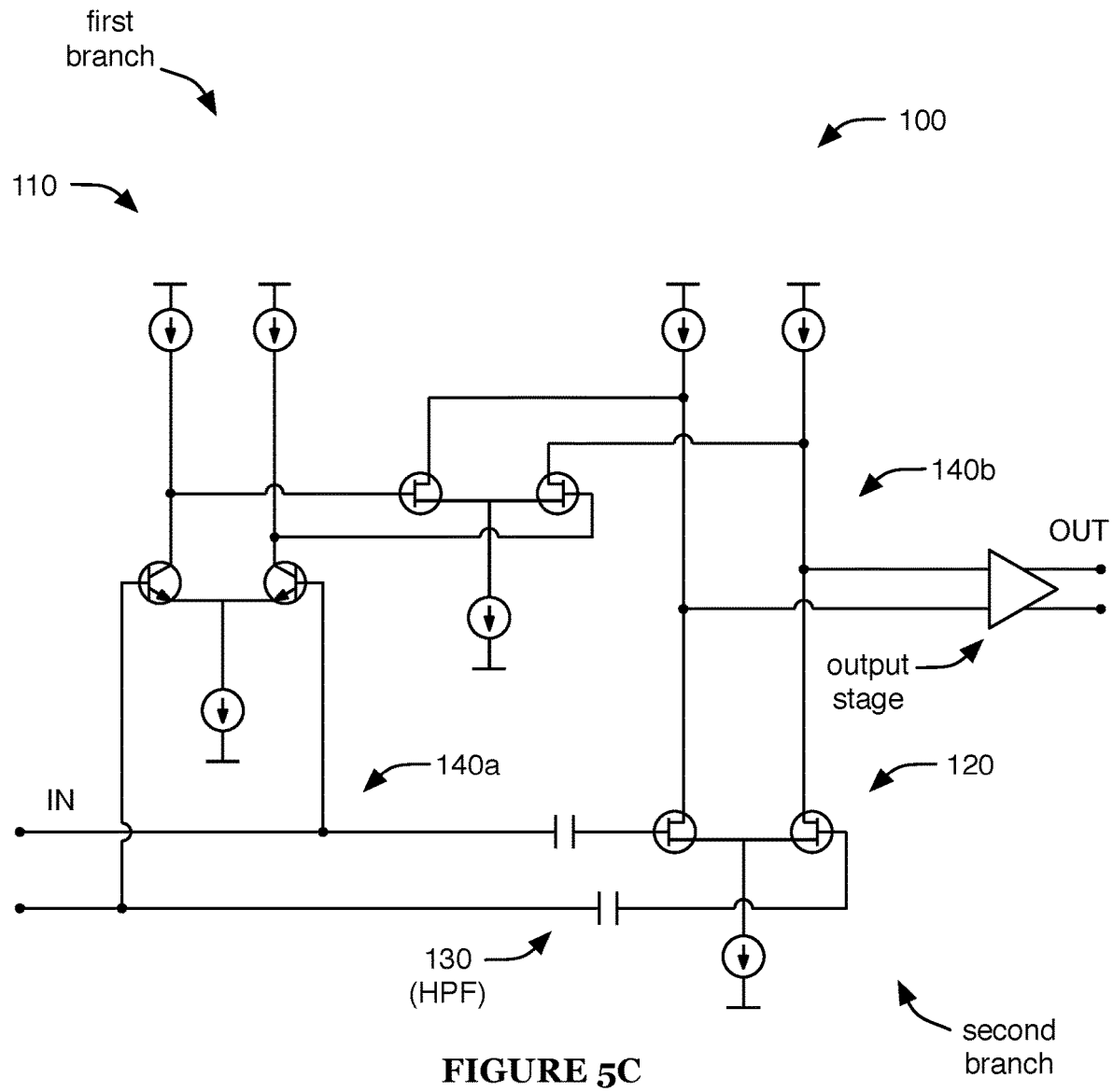
FIG. 5C is a diagram view of an example of the system depicted in FIG. 5B.

In a specific example, the system includes: a first set of signal couplers 140a which split an input signal between two parallel paths; an amplification stage 110, 120 along each of the two paths; and a second set of signal couplers 140b (e.g., summing nodes) that recombine the signals from the two paths. In this specific example, the first path includes a BJT-based primary amplification stage 110 (which optionally includes a FET-based substage following the BJTs), and the second path includes a high-pass filter (e.g., series capacitor) and a FET-based (e.g., MOSFET, such as CMOS-based) secondary amplification stage 120 (e.g., as shown in FIG. 5C, which also depicts an output amplification stage, such as a CMOS-based stage, after the summing nodes).

Figure 2A:
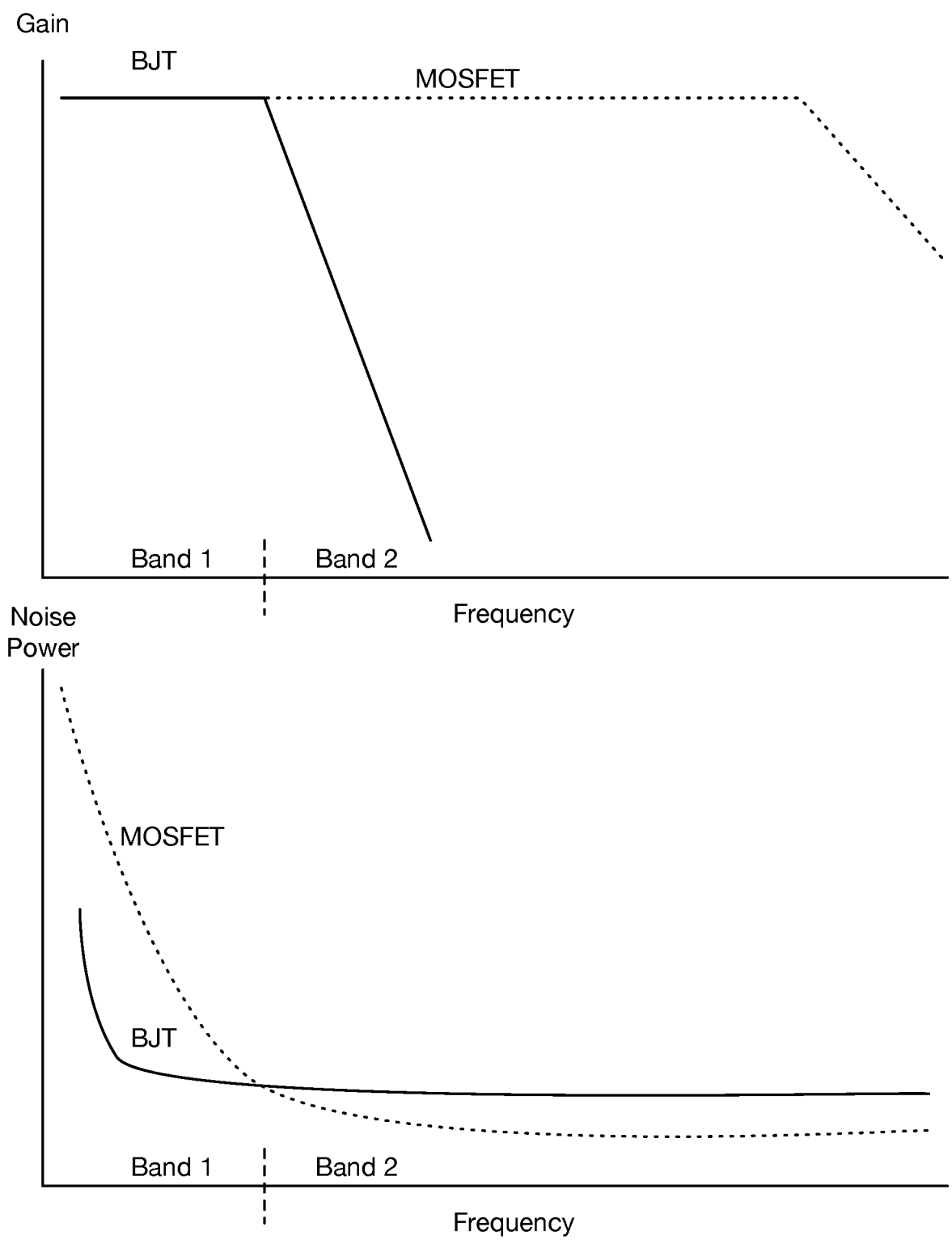
FIGS. 2A-2C is are example graph views of system output characteristics.
Figure 2B:
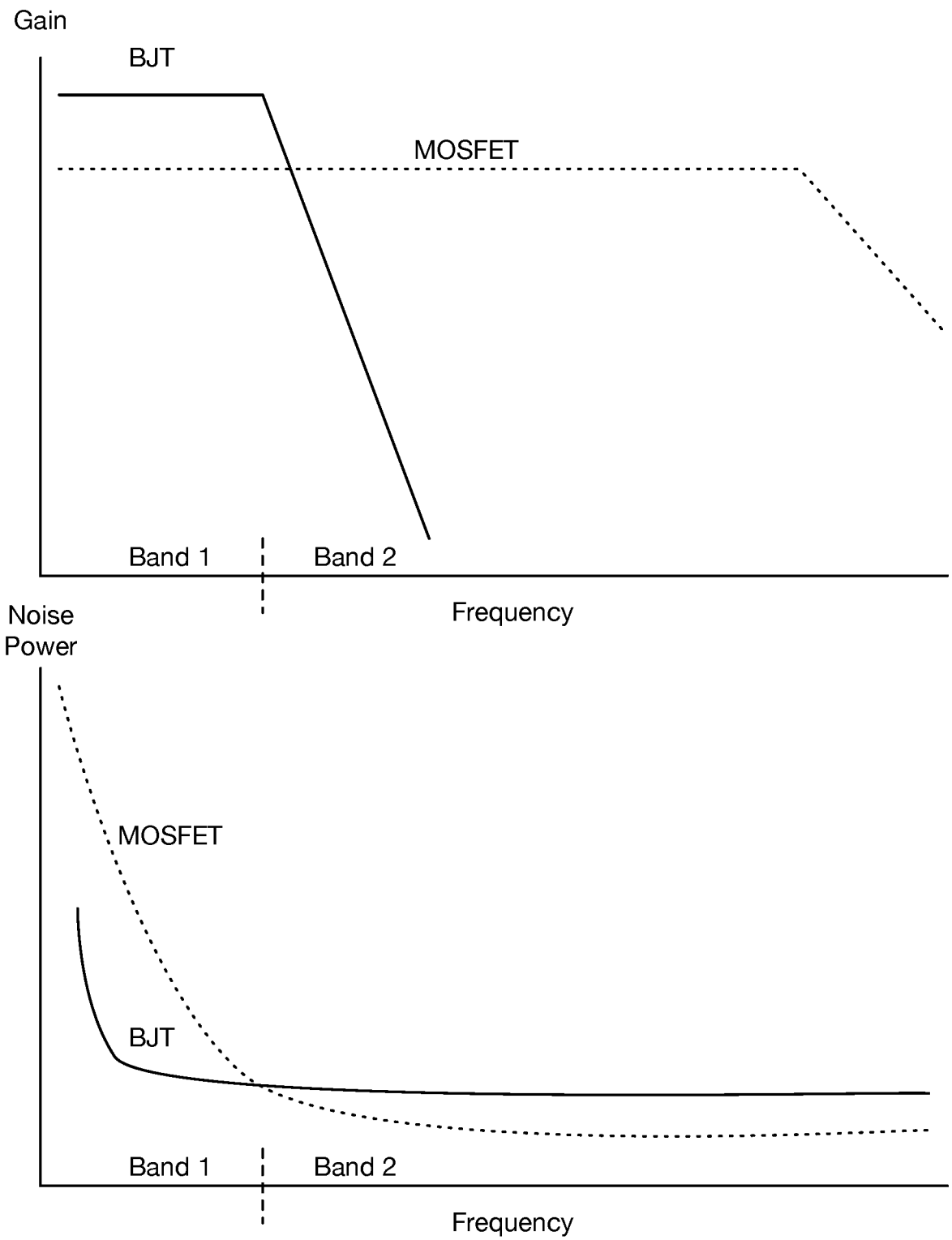
Figure 2C:
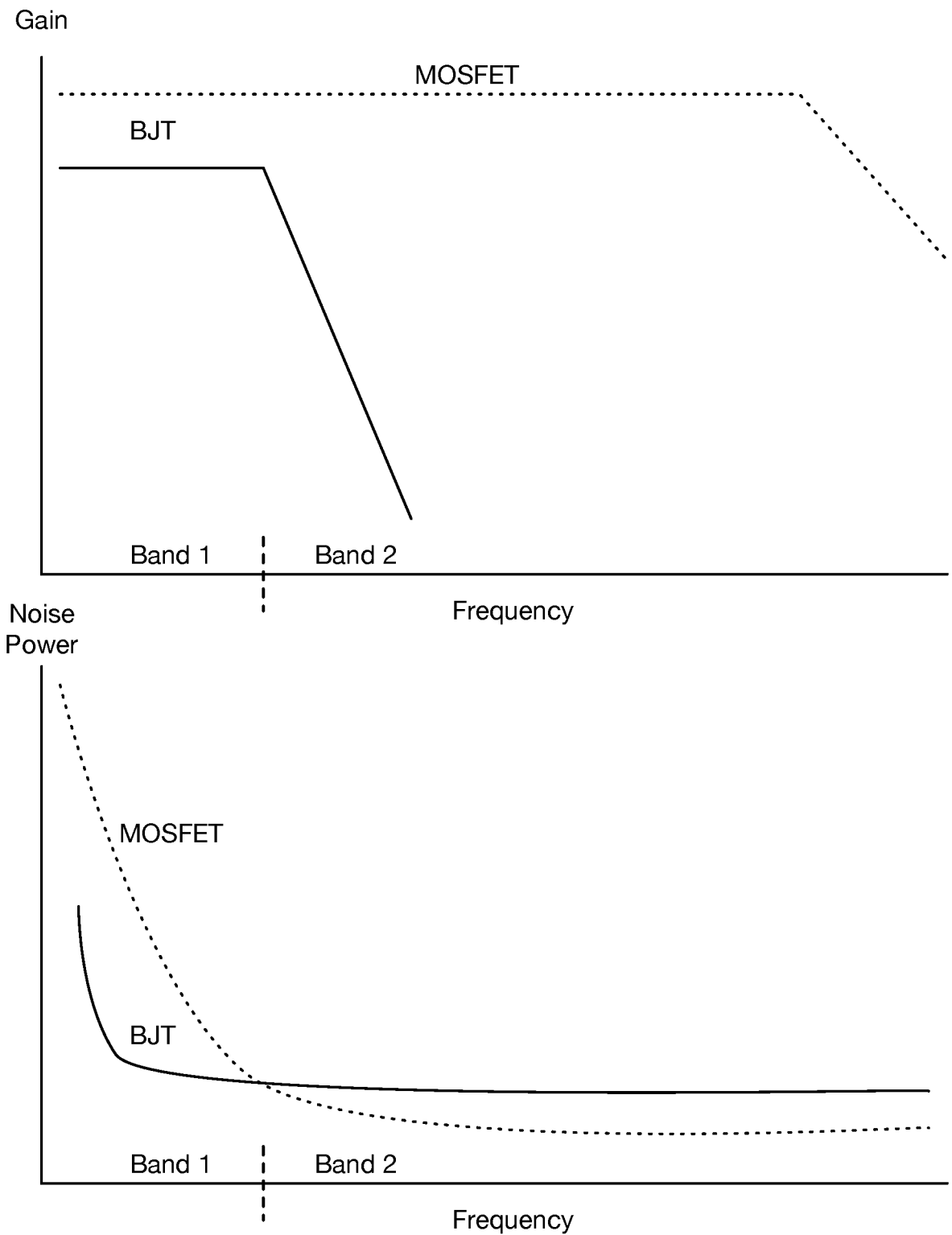
Figure 3A:
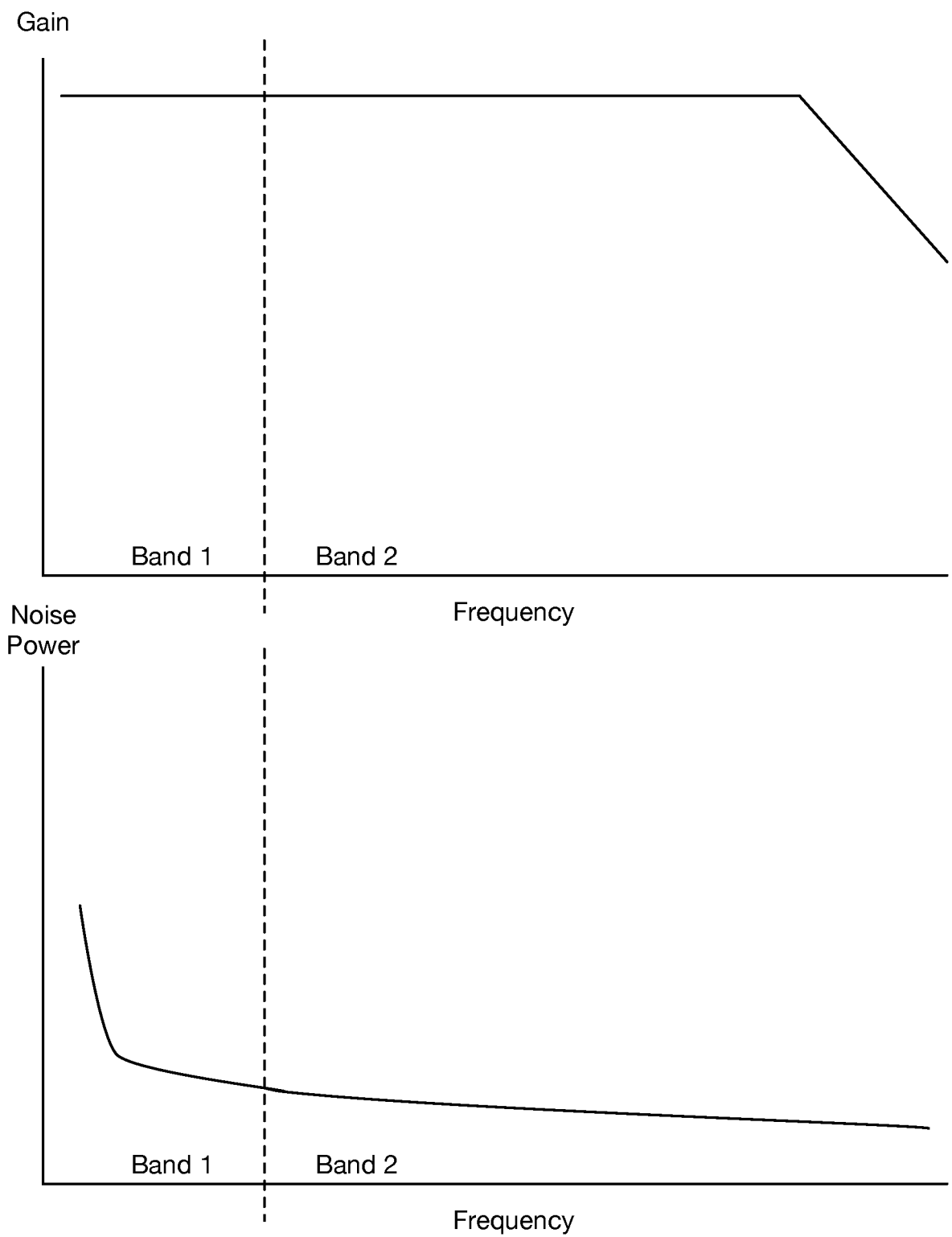
FIGS. 3A-3C is are example graph views of system output characteristics.
Figure 3B:
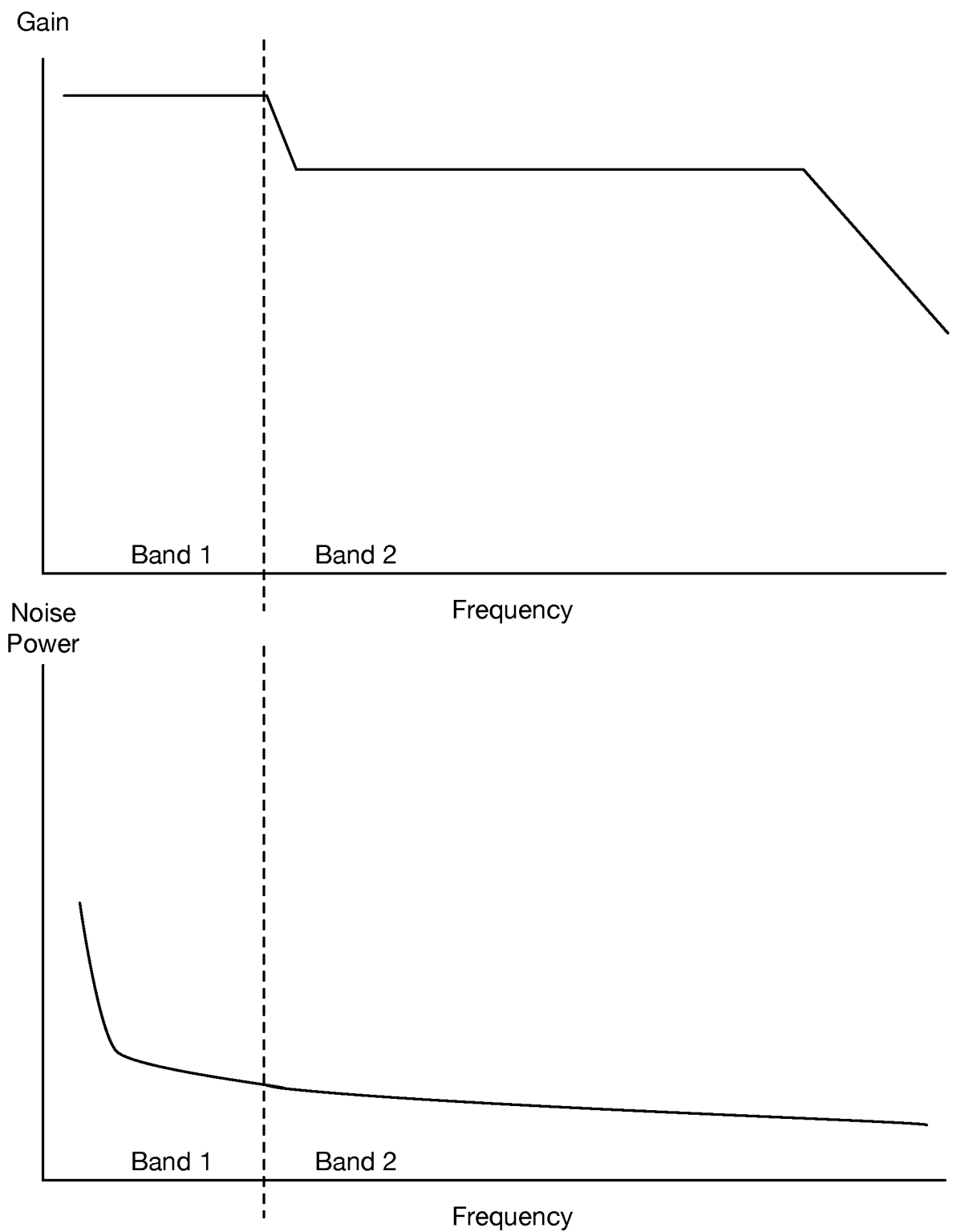
Figure 3C:
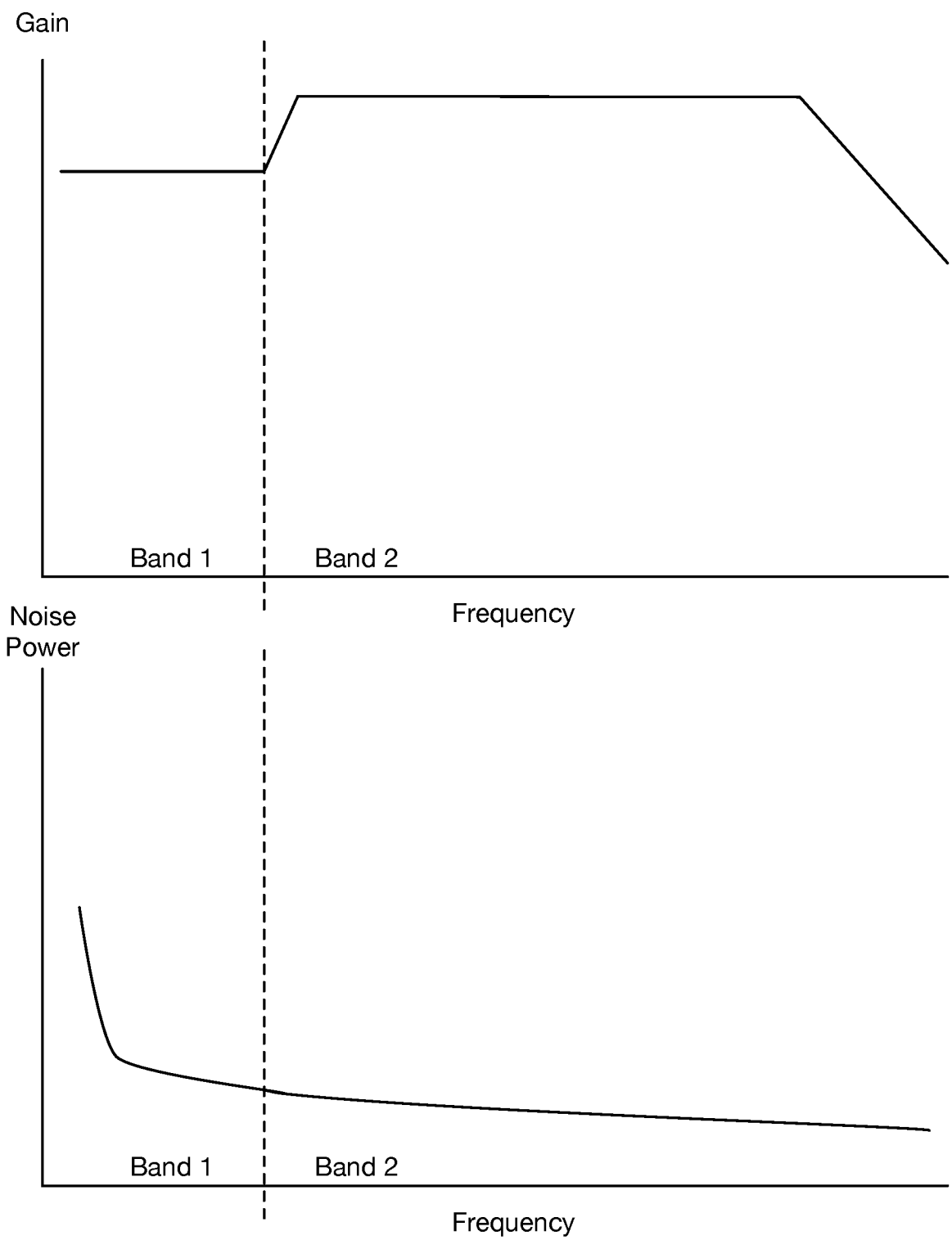

Such low-pass filter-free architectures can additionally or alternatively be employed in implementations in which the gain of stage 1 is not necessarily negligible throughout the entirety of Band 2 (but preferably rolls off to become negligible within Band 2, preferably near the transition from Band 1 to Band 2), such as shown in FIGS. 2A-2C, which can give rise to response curves with transitions such as shown in FIGS. 3A-3C.

Likewise, it is understood that filtering may be combined with an amplifier stage; for example, a coupling capacitor at the input of an amplification stage may serve as a high-pass filter; or amplifier parameters (e.g., compensation) may be modified to provide a particular response (e.g., low-pass filtering in a BJT branch). For example, a compensation capacitor of a BJT amplifier stage, such as between the BJT stage's output and (inverting) input, can function (e.g., in combination with a resistive element such as an input resistor) as a low-pass filter for the BJT branch.

Figure 6A:
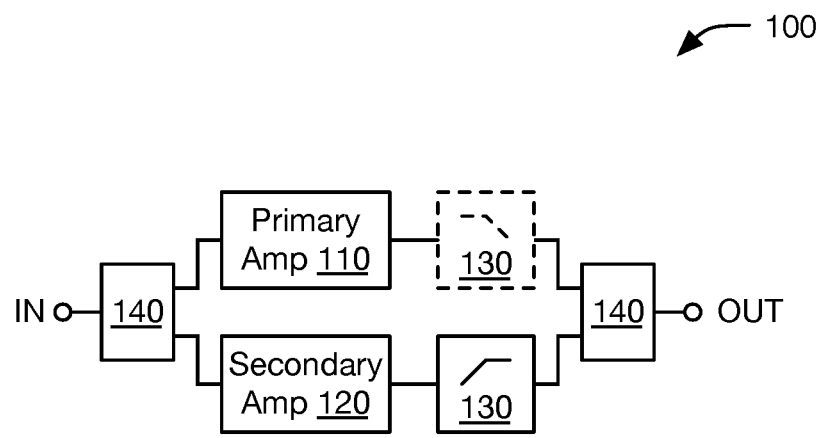
FIG. 6A is a diagram view of a system of an invention embodiment.

Note also that, for some or all branches, filtering may optionally occur at the output of amplification, rather than and/or in addition to at the input, such as shown by way of example in FIG. 6A. In general, a person of skill in the art will understand that, although a filter (e.g., LPF, HPF, etc.) may be described and/or depicted as appearing before an amplifier, the system can additionally or alternatively include an analogous filter after the amplifier, and/or vice versa. Further, for amplifier stages including series-connected substages, the system can additionally or alternatively include an analogous filter between some or all such substages, such as after a first substage and before a second substage.

Figure 6B:
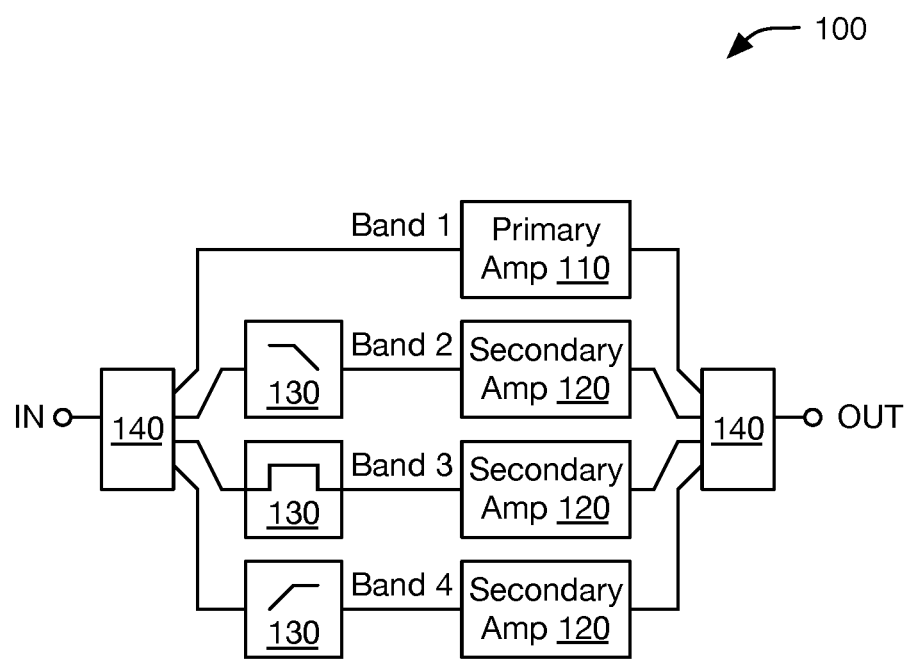
FIG. 6B is a diagram view of a system of an invention embodiment.

Likewise, any number of branches, having any types of filtering, may be combined in implementations of the system 100 (e.g., as shown in FIG. 6B), preferably wherein each branch is associated with (e.g., amplifies) a different band. Some or all such branches preferably include amplification stages (e.g., primary and/or secondary) such as described above, and can optionally include filters (e.g., such as described above) and/or any other suitable elements. In a specific example, a first branch (e.g., including a low-pass filter) amplifies a first band (e.g., lower-frequency band), a second branch (e.g., including a band-pass filter) amplifies a second band (e.g., intermediate-frequency band, such as higher-frequency than the first band), and a third branch (e.g., including a high-pass filter) amplifies a third band (e.g., higher-frequency band, such as higher-frequency than the first and second bands).

In one example of a system including three branches, the first branch includes a BJT-based primary amplification stage 110, the second branch includes a MOSFET-based secondary amplification stage 120a, and the third branch includes a secondary amplification stage 120b exhibiting characteristics different from the stages 110, 120a. In a first specific example, the secondary amplification stage 120b is a JFET-based stage. In a second specific example, the secondary amplification stage 120b is a second BJT-based stage, wherein its current density is substantially different from that of the BJT-based primary amplification stage 110.

3.2 Series-Parallel Amplifier Stage Architectures

As shown in FIG. 1B, the amplification stages of the system 100 need not all be connected in parallel. Rather, the system can optionally include one or more amplification stages (and/or sets of amplification stages, such as parallel amplification stages, optionally including band-splitting filters) connected in series with other amplification stages (e.g., with a first set of parallel amplification stages).

In some embodiments, the system can include a set of parallel amplification stages (e.g., as described above, such as regarding section 3.1), preceded and/or followed by a single amplification stage connected in series with the parallel amplification stages (e.g., preceding an input coupler 140a or following an output coupler 140b, respectively), such as shown by way of example in FIG. 5C.

The system can additionally or alternatively include multiple sets of parallel amplification stages, wherein the sets (or a subset thereof) can each be as described above, such as regarding section 3.1. For example, each set of the system can include a primary-band amplification stage 110, one or more secondary-band amplification stages 120, filters 130, wherein each component of a set is the same as or different from (e.g., in characteristics, numerosity, circuit topology, etc.) the corresponding components (if any) of the other sets. Each set can further include one or more signal couplers 140; in some embodiments, the output coupler of a first set can also be the input coupler of a second set. In a first variant, the sets are connected with each other in series (e.g., analogous to connecting the output of a first embodiment of the system to the input of a second embodiment of the system). In a second variant, some sets are connected in series and others are connected in parallel. However, the sets can additionally or alternatively be connected in any other suitable combination of parallel and series connections.

Figure 7A:
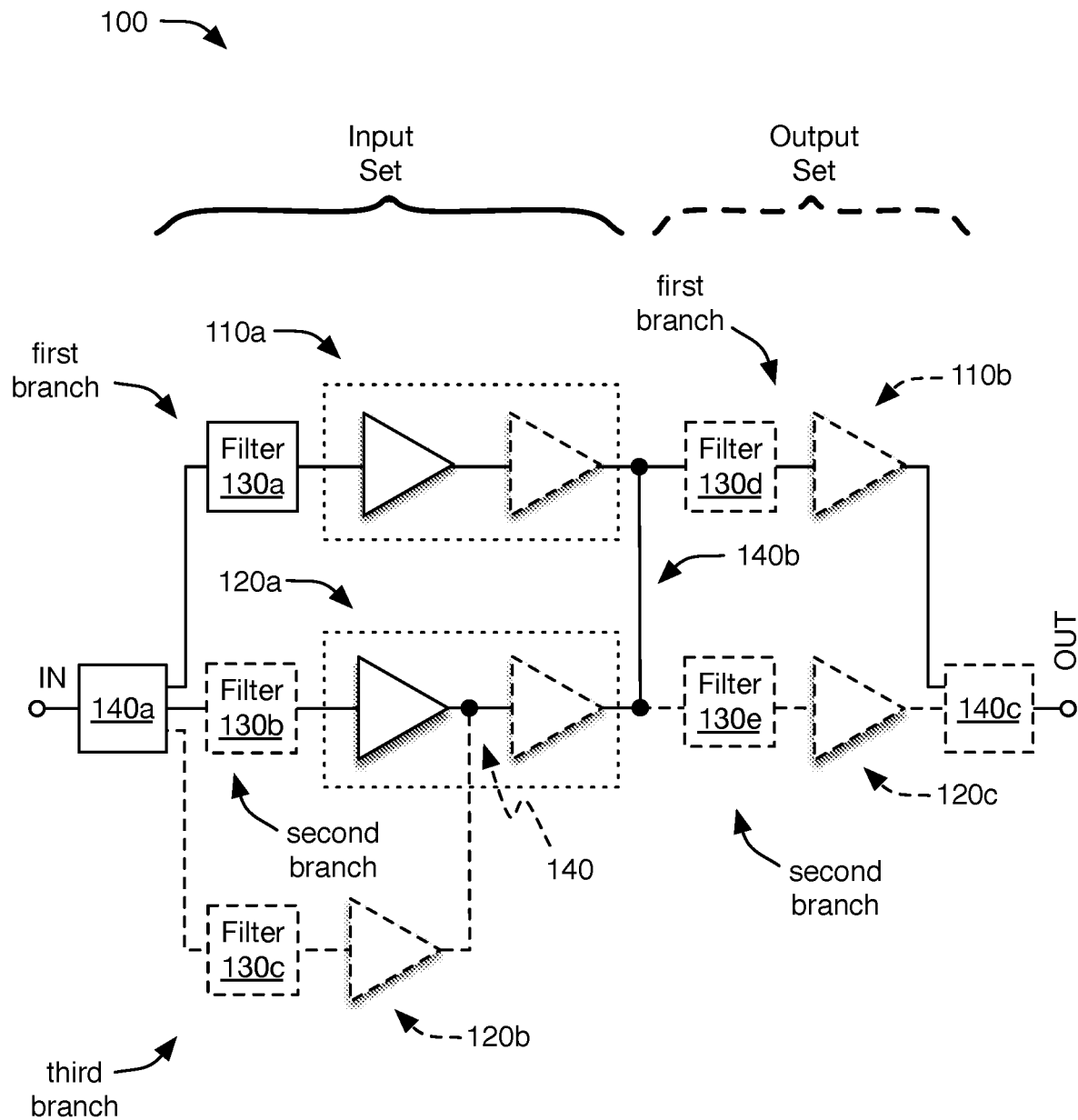
FIG. 7A is a diagram view of a system of an invention embodiment.
Figure 7B:
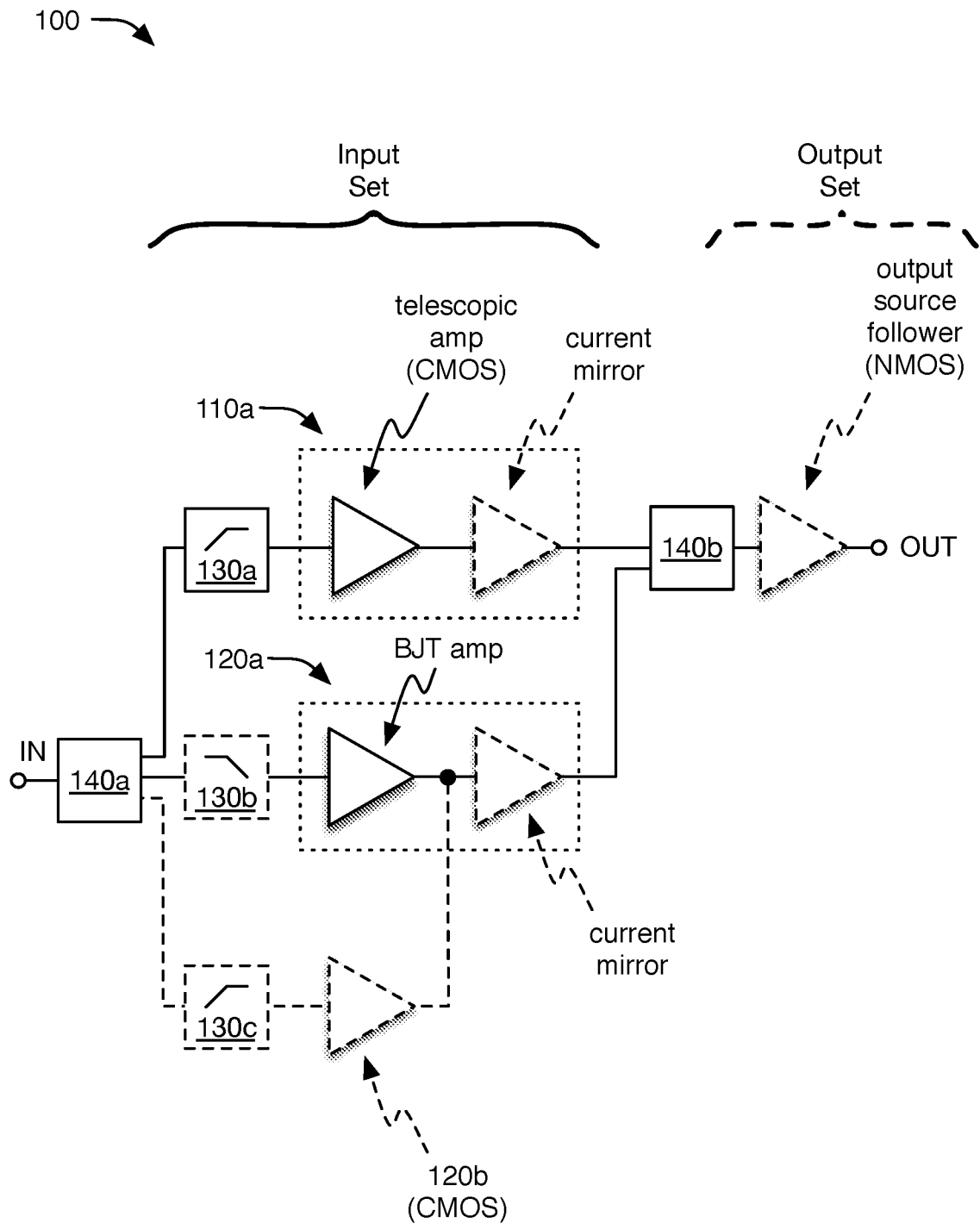
FIGS. 7B-7C are diagram views of a first and second example, respectively, of the system depicted in FIG. 7A.
Figure 7C:
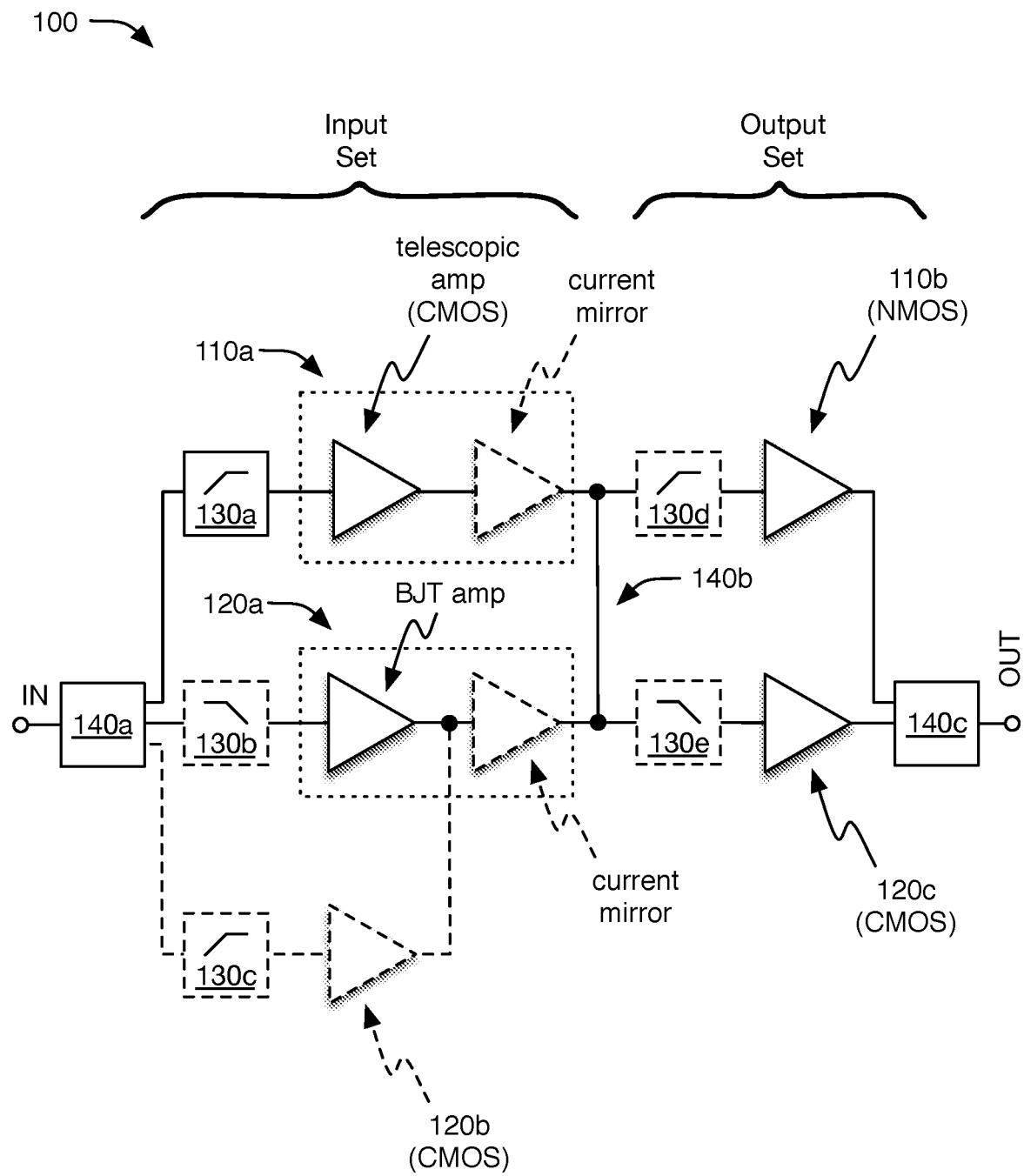

As shown by way of example in FIG. 7A, an embodiment of the system includes an input set of parallel amplification stages (optionally including one or more filters 130), and can optionally include an output set of one or more amplification stages (e.g., parallel amplification stages) connected in series with the input set (also optionally including one or more filters 130). An input signal is preferably split between the parallel branches of the input set via a signal coupler 140a, and the output signals from the branches of the input set are preferably merged via a signal coupler 140b (which can also split the merged signal between parallel branches of an output set, if applicable). In some examples including an output set (e.g., in which the output set includes a plurality of parallel branches), the system can optionally include a signal coupler 140c that merges the output signals from the output set.

The input set preferably includes a primary amplification stage 110a and a secondary amplification stage 120a, and can optionally include an additional secondary amplification stage 120b (or multiple additional secondary amplification stages). The primary amplification stage 110a is preferably connected in series with one or more filters 130, and one or more of the secondary amplification stages can additionally or alternatively be connected in series with one or more filters 130.

Each amplification stage can include one or more series-connected sub-stages. For example, the primary and secondary amplification stages 110a, 120a can each include a first sub-stage followed by a current mirror sub-stage (e.g., as shown in FIGS. 7B-7C). The current mirrors can function to achieve current-mode gain while facilitating the combination of signals from two or more branches of the input set (e.g., from the primary stage 110a and the secondary stage 120a). In alternate variations, the stages can additionally or alternatively include voltage amplifiers, optionally combined with elements that can enable similar functionality (e.g., resistors, transformers, capacitor-T circuits, etc.), and/or can include any other suitable elements. In some examples, the stage 120a includes a first sub-stage and a second sub-stage, and the stage 120b is connected between the first and second sub-stages (i.e., in parallel with the first sub-stage and in series with the second sub-stage).

The output set can include one or more amplification stages and/or filters. In examples in which the output set includes multiple amplification stages connected in parallel (e.g., a primary amplification stage 110b connected in parallel with a secondary amplification stage 120c), one or more of the stages is preferably connected in series with one or more filters 130. Analogous to the input set, each amplification stage of the output set can include one or more series-connected sub-stages.

In an example of this embodiment, the system includes an input set such as shown by way of example in FIGS. 7B-7C. The primary amplification stage 110a of the input set includes a CMOS telescopic amplifier, which can function to provide high gain and lower noise for higher-frequency portions of the signal. A secondary amplification stage 120a of the input set includes a BJT amplifier (e.g., NPN transistor-based), which can function to provide lower noise for lower-frequency portions of the signal.

Accordingly, in this example, the signal through the primary stage 110a is preferably filtered by (e.g., wherein the primary stage 110a is preceded by) a high-pass filter 130a (e.g., implemented in part or in whole by one or more capacitors in series with the primary stage 110a), which can function to direct the lower-frequency signal through the secondary stage 120a and/or reduce the amount of lower-frequency signal passing through the primary stage 110a. The high-pass filter 130a preferably has cutoff frequency at or around a threshold noise crossover frequency, at which the noise characteristics of the primary stage 110a and the secondary stage 120a cross (e.g., 300-1000 kHz, 750 kHz-5 MHz, 700-1200 kHz, 1-3 MHz, 2-5 MHz, 3-10 MHz, less than 300 kHz, greater than 10 MHz, etc.). However, the high-pass filter 130a can alternatively have any other suitable cutoff frequency (or, in examples in which the high-pass filter 130a includes multiple poles, can additionally or alternatively include filter poles with any other suitable cutoff frequencies).

In this example, the signal through the secondary stage 120a can optionally be filtered by (e.g, wherein the secondary stage 120a is preceded by) a low-pass filter 130b. For example, a compensation capacitor (e.g., connected from the BJT amplifier output to its inverting input), together with an input resistor, can function to define the low-pass filter 130b. Additionally or alternatively, the BJT amplifier's roll-off characteristic can function to minimize the passage of higher-frequency signal portions through the secondary stage 120a. The cutoff frequency of the low-pass filter 130b (and/or the corner frequency of the BJT amplifier gain characteristic) can be similar to (e.g., substantially equal to, within 10% of, etc.) the high-pass cutoff for the primary stage and/or to the threshold noise crossover frequency, greater than the high-pass cutoff and/or the crossover by a threshold amount (e.g., at least 25%, 50%, 100%, 150%, or 200% greater, etc.), less than the high-pass cutoff and/or the crossover, and/or have any other suitable relationship to the high-pass cutoff frequency and/or to the threshold noise crossover frequency. In specific examples, the cutoff frequency (and/or corner frequency) can be 300-1000 kHz, 750 kHz-5 MHz, 700-1200 kHz, 1-3 MHz, 2-5 MHz, or 3-10 MHz; can be less than 300 kHz, 1 MHz, 2 MHz, 3 MHz, 5 MHz, etc.; and/or can be greater than 500 kHz, 750 kHz, 1 MHz, 2 MHz, 3 MHz, 5 MHz, 10 MHz, etc. The signal through the secondary stage 120a is preferably not filtered by a high-pass filter, which can enable DC signals to propagate through and/or be amplified by the secondary stage 120a.

In this example, the primary stage 110a can optionally include a current mirror (and/or any other suitable elements, such as described above) following the CMOS telescopic amplifier, and/or the secondary stage 120a can optionally include a current mirror (and/or any other suitable elements, such as described above) following the BJT amplifier. The outputs of the primary stage 110a and secondary stage 120a are preferably merged at the signal coupler 140b.

In this example, the input set can optionally include an additional secondary amplification stage 120b, such as one including a CMOS amplifier (e.g., with similar or different characteristics as the CMOS telescopic amplifier of the primary stage 110a. The through the secondary stage 120a can optionally be filtered by (e.g., wherein the stage 120b is preceded by) a high-pass filter 130c (e.g., implemented in part or in whole by one or more capacitors in series with the stage 120b), which can have an analogous function to that of the filter 130a. The filter 130c can have similar or different properties (e.g., cutoff frequency) to the filter 130a. In an alternate variation, the primary stage 110a and the secondary stage 120b can share a single high-pass filter (e.g., wherein a signal propagating through either stage is filtered by the high-pass filter).

In a variant of this example in which the stage 120a includes a current mirror (and/or any other suitable elements satisfying an analogous function), the stage 120b can be connected to the stage 120a between the BJT amplifier and the current mirror (i.e., in parallel with the BJT amplifier and in series with the current mirror). In an alternate example, the stage 120b can include a separate current mirror (e.g., following the CMOS amplifier), and the output of the stage 120b can be merged with the other outputs at the signal coupler 140b.

A first specific example of this example is depicted in FIG. 7B. In this specific example, the system can optionally include an output set connected in series with the input set (e.g., receiving the signal from the coupler 140b). The output set preferably includes a single output source follower (e.g., NMOS amplifier). In this example, the output set preferably does not include any branches or frequency filters that substantially filter within the signal bandwidth, but can alternatively include any suitable elements.

A second specific example of this example is depicted in FIG. 7B. In this specific example, the system preferably includes an output set connected in series with the input set (e.g., receiving the signal from the coupler 140b). The output set preferably includes a primary amplification stage 110b and a secondary amplification stage 120c connected in parallel with each other, which can receive the signal from the coupler 140b and can output signals to be merged by coupler 140c.

In the second specific example, the primary stage 110b preferably includes an NMOS amplifier. Analogous to the primary stage 110a, the signal through the primary stage 110b is preferably filtered by (e.g., wherein the primary stage 110b is preceded by) a high-pass filter 130d (e.g., implemented in part or in whole by one or more capacitors in series with the primary stage 110b), which can function to direct the lower-frequency signal through the secondary stage 120c and/or reduce the amount of lower-frequency signal passing through the primary stage 110b. The high-pass filter 130a preferably has cutoff frequency at or around a threshold noise crossover frequency for the output set (e.g., based on the noise characteristics of the primary stage 110b and secondary stage 120c), such as equal to, substantially equal to, or different from the cutoff frequency of the high-pass filter 130a. The properties of the high-pass filter 130d can be the same as or different from those of the high-pass filter 130a.

In the second specific example, the secondary stage 120c preferably includes a CMOS amplifier. Analogous to the description above regarding the secondary stage 120a, the signal through the secondary stage 120c can optionally be filtered by a low-pass filter 130e (which can have the same or different properties as described above regarding the low-pass filter 130b), and/or the amplifier's roll-off characteristic can function to minimize the passage of higher-frequency signal portions through the secondary stage 120c.

Variants of this embodiment can optionally include one or more additional sets of amplification stages (e.g., connected in series between the input and output set, before the input set, after the output set; connected in parallel with one or more of the other sets; etc.). The additional sets can include amplification stages connected in parallel with each other. However, each such set can additionally or alternatively include a variety of amplification stages (and/or sub-stages of such stages) connected by a variety of series and/or parallel connections.

However, the amplifier stages can additionally or alternatively define other suitable architecture.

4. Applications

The system 100 may find use in a variety of applications. In any such applications, the system can include any suitable amplifier elements and/or architectures described above, and/or can include any other suitable amplifier (e.g., split-frequency amplifier).

4.1 Mixer Applications

Figure 8A:
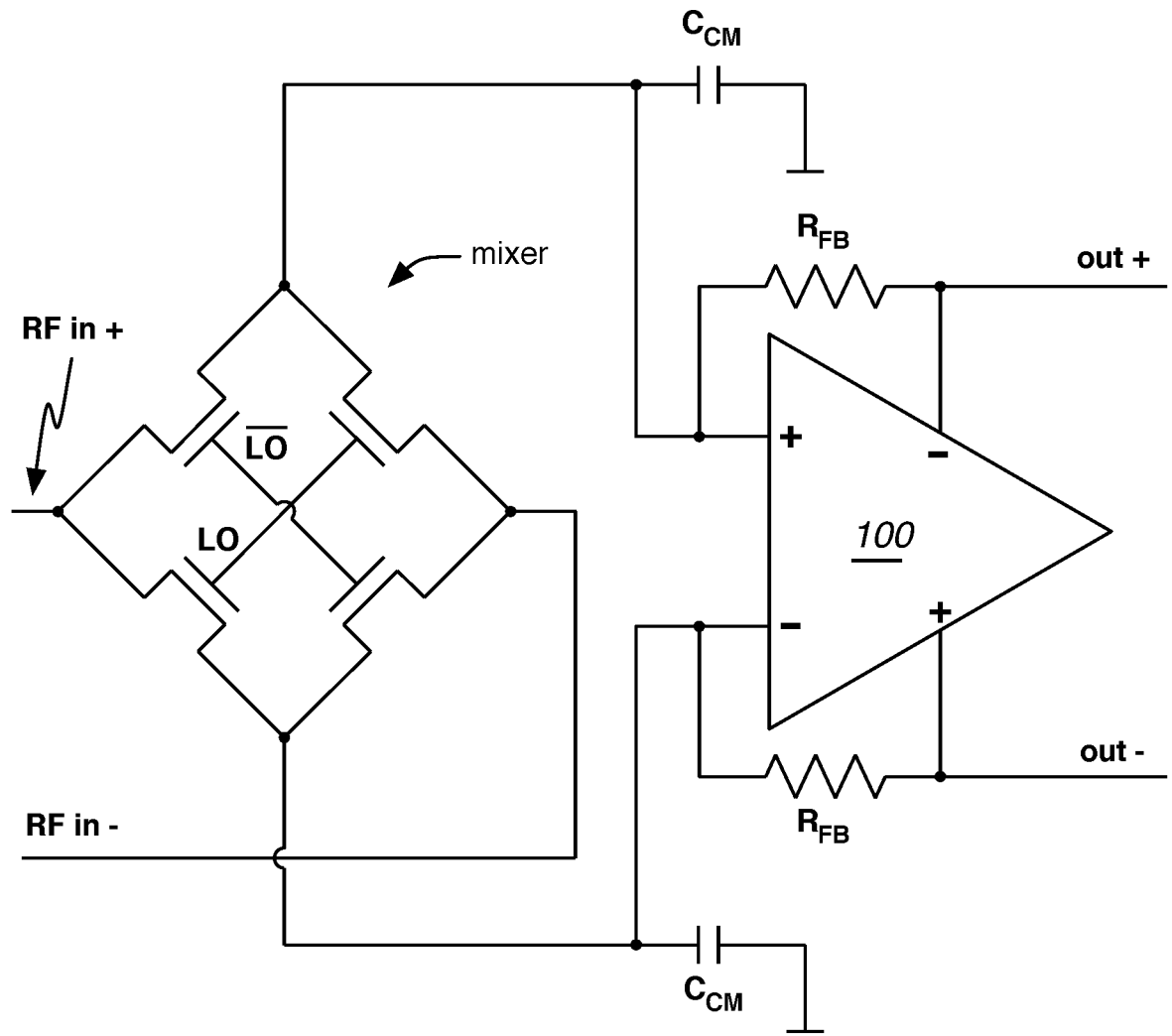
FIGS. 8A-8B are diagram views of first and second example, respectively, of a mixer implementation of a system of an invention embodiment.
Figure 8B:
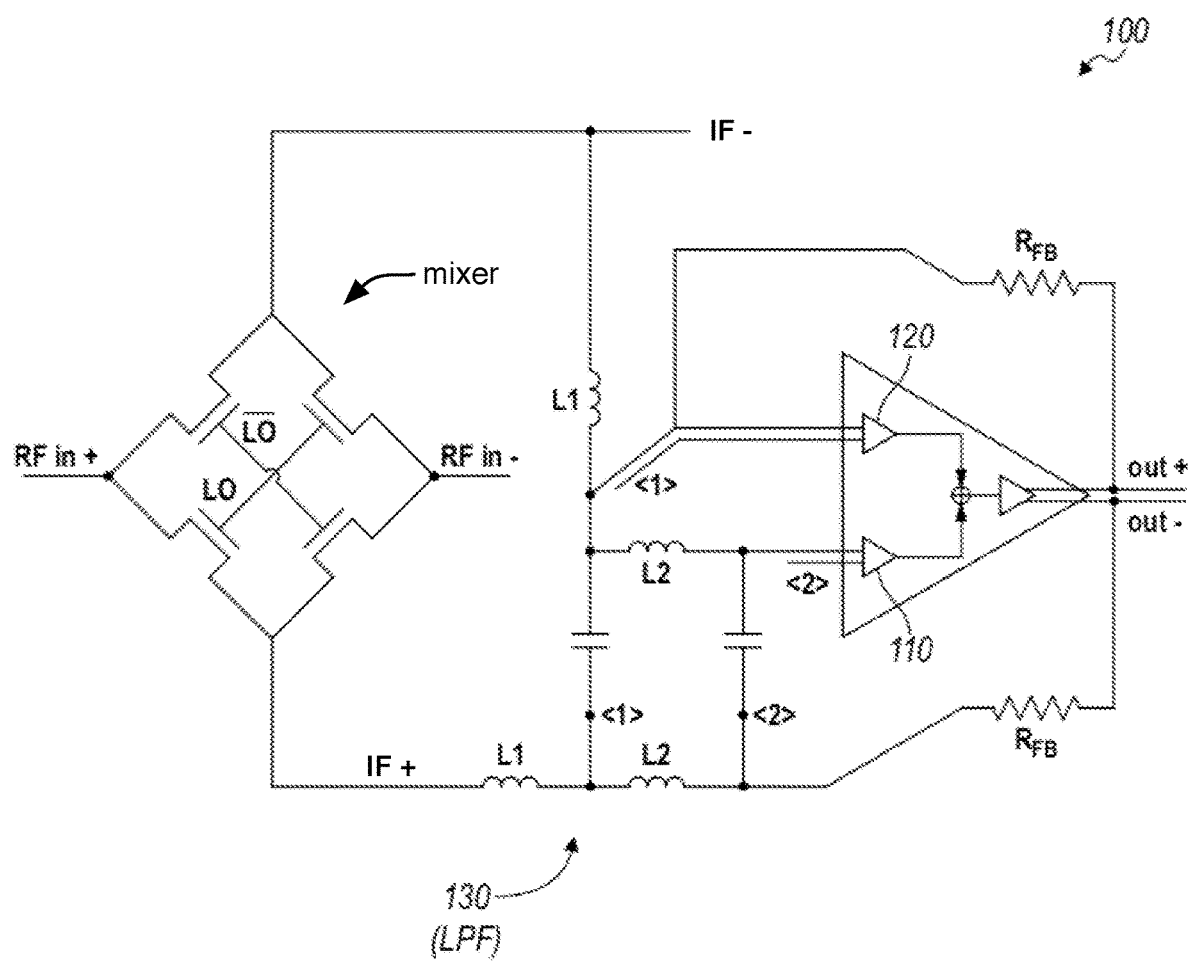

In one variation, as shown by way of examples in FIGS. 8A-8B, the system 100 may be used as an amplifier (e.g., transimpedance amplifier (TIA)) in a mixer application (e.g., wherein the output of a mixer, such as a passive mixer quad, is provided to the TIA). In such an application, the use of a split-frequency amplifier can provide beneficial amplification characteristics (e.g., as described above in more detail). For example, the TIA can include a bipolar transistor branch, which may be useful for low frequencies (as in previous examples) due to higher gain and lower flicker noise (relative to a MOSFET branch), and a MOSFET branch, which may be used for high frequencies.

In this variation, an RF input (preferably a differential input but alternatively a single-ended input) is preferably provided (e.g., via a matching network) to a mixer, preferably a passive mixer quad (e.g., controlled by the local oscillator inputs LO, $\overline{LO}$), which generates an intermediary signal (e.g., intermediate frequency (IF) signal; preferably a differential signal but alternatively a single-ended signal) based on the RF input. In some examples, the RF input can be coupled to the mixer via one or more matching networks (e.g., T-match, pi-match, and/or L-match networks). In this variation, the output of the mixer is preferably provided to the transimpedance amplifier, which produces an output (e.g., IF, near-zero IF (NZIF), or baseband (BB) output; preferably a differential output but alternatively a single-ended output) based on the mixer output. For example, (e.g., as shown in FIG. 8A), the mixer output can be provided substantially directly to the TIA (e.g., wherein the signal is split within the TIA into different frequency bands, which are amplified by different parallel stages of the TIA, such as a CMOS transistor-based stage and a BJT-based stage), which then produces an output.

In some examples of this variation, the mixer output is provided to the TIA via a multi-stage low-pass filter. In one example (e.g., as shown in FIG. 8B), in which the TIA includes a low-bandwidth, lower-noise primary-band amplification stage 110 (e.g., BJT-based) and a high-bandwidth, higher-noise (e.g., at low frequencies, such as frequencies at which the primary amp also has significant gain) secondary-band amplification stage 120 (e.g., MOSFET-based), the mixer output can be provided to the secondary amp 120 after a single stage of the low-pass filter, and to the primary amp 110 after multiple (e.g., 2) stages of the low-pass filter. In this example, the first filter stage preferably has a cutoff frequency greater than the signal bandwidth (e.g., 2-5 times greater than the signal bandwidth), such that the high-frequency portions of the signal propagate to the secondary amp 120; this signal path preferably also includes a high-pass filter (e.g., series capacitor) that functions to prevent the low-frequency portions of the signal from propagating to the secondary amp. In this example, the second filter stage preferably has a cutoff frequency less than the signal bandwidth (e.g., at or around a threshold noise crossover frequency, at which the noise characteristics of the two amplifier stages cross, such as 300-1000 kHz, 750 kHz-5 MHz, 1-3 MHz, 3-10 MHz, less than 300 kHz, greater than 10 MHz, etc.), such that only the low-frequency portions of the signal propagate to the primary amp 110. Alternatively, the inputs to primary and secondary amplifier paths can be provided via two separate low-pass filters (e.g., one having a cutoff frequency similar to the first stage described above, and the other having a cutoff frequency similar to the second stage described above, thereby achieving analogous band separation).

Although described herein as a TIA, a person of skill in the art will recognize that this mixer application is not limited to use of a transimpedance amplifier. Rather, the system can be employed as any suitable amplifier applied at the IF, NZIF, or BB side of any suitable mixer (e.g., active or passive mixer).

4.2 Voltage-Controlled Oscillator Applications

Figure 9:
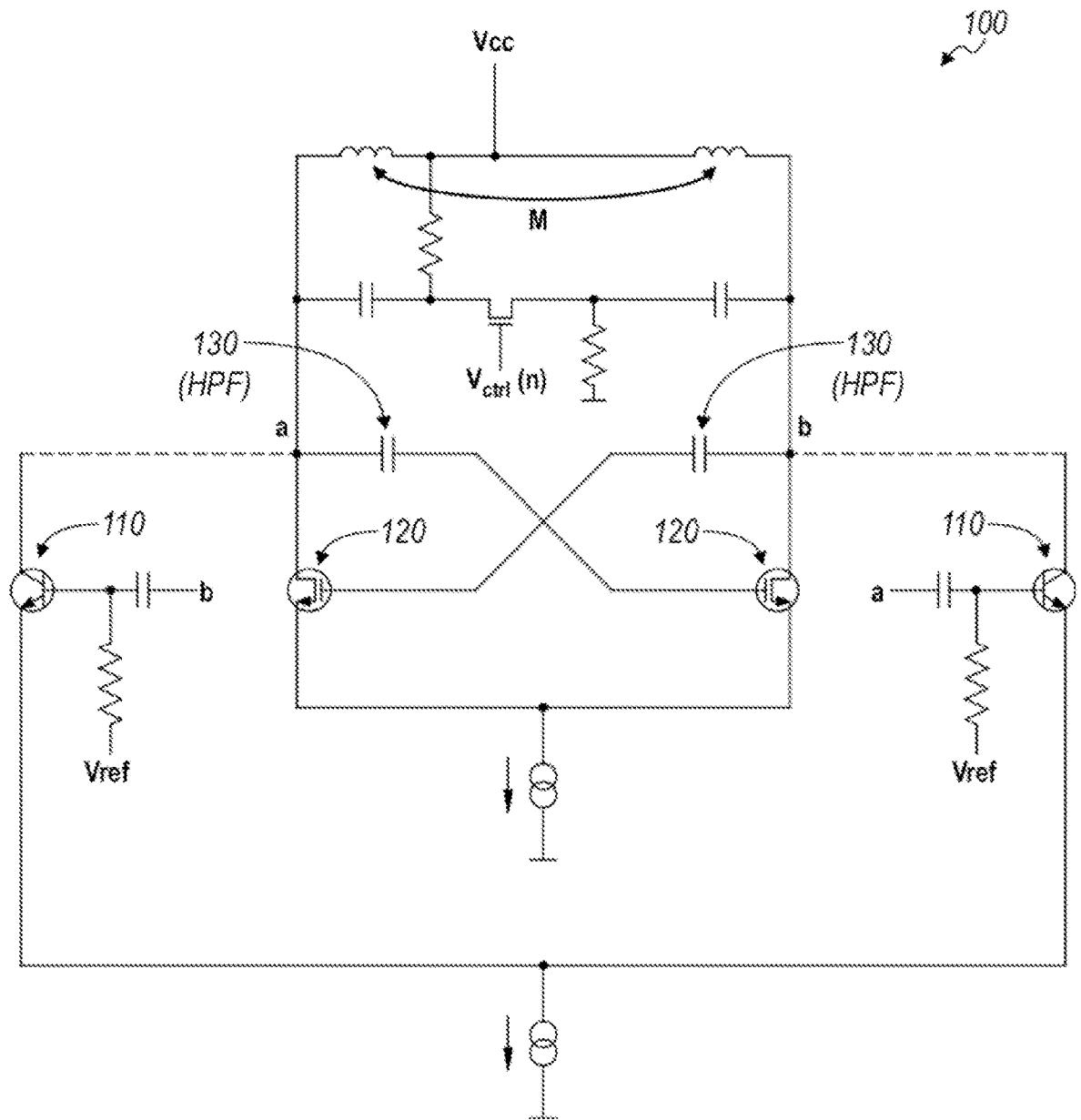
FIG. 9 is a diagram view of a VCO implementation of a system of an invention embodiment.

In another variation, the system 100 may find use in a negative feedback amplifier for a voltage-controlled oscillator (VCO) to accomplish a similar purpose. In one example (e.g., as shown in FIG. 9), bipolar transistors are placed in parallel with MOSFETs (e.g., NMOS). In this variation, the BJTs are preferably small (e.g., base width less than 1, 0.3, 0.1, 0.05, 0.02, and/or 0.01 microns) and/or preferably exhibit high transconductance (e.g., $g_m$ greater than 1, 3, 10, 20, 50, 100, 150, 200, 300, 400, 600, 800, and/or 1000 mS, etc.). To achieve high transconductance, a high DC collector current ($I_C$) is typically needed (e.g., for $g_m \geq 1$ S, $I_C \geq 25$ mA would be needed, assuming a room-temperature thermal voltage of approximately 25 mV); a large emitter width may be required to achieve such DC collector currents (e.g., for a typical CMOS, rather than BiCMOS, fabrication process, an emitter width of 200-500 microns or more may be required to achieve $I_C \geq 25$ mA). As noted above, the transition frequency $f_T$ of the BJTs is preferably substantially less than that of the MOSFETs; accordingly, the high-frequency components of the signal will pass predominantly through the MOSFET-based amplifier stage 120, even without use of a low-pass filter in the path of the BJT-based amplifier stage 110. In contrast, the amplifier preferably includes one or more high-pass filters in the path of the MOSFET-based amplifier stage (e.g., formed in part by a capacitor in series with each MOSFET gate, such as shown by way of example in FIG. 9). Note that, in this variation, the RC networks at the base of each BJT may, via variation of the coupled reference voltage $V_{ref}$, be used to modify characteristics of the amplifier (e.g., to control characteristics of the VCO output, such as oscillation frequency, phase, etc.).

4.3 Interference Cancellation Applications

In another variation, the system 100 may find use in an analog interference canceller (e.g., self-interference canceller, such as described above regarding full-duplex wireless communication systems). For example, the system can be integrated into an analog self-interference canceller (e.g., canceller such as described in U.S. patent application Ser. No. 14/728,501, filed 2 Jun. 2015, and/or in U.S. patent application Ser. No. 16/808,624, filed 4 Mar. 2020, each of which is herein incorporated in its entirety by this reference), such as by serving as one or more amplifiers (or portions thereof) of such a canceller.

More generally speaking, the system 100 may find use in any circuit in which amplification is desired (e.g., active filtering, summing, impedance conversion, calibration, etc.).

5. Method

Figure 10:
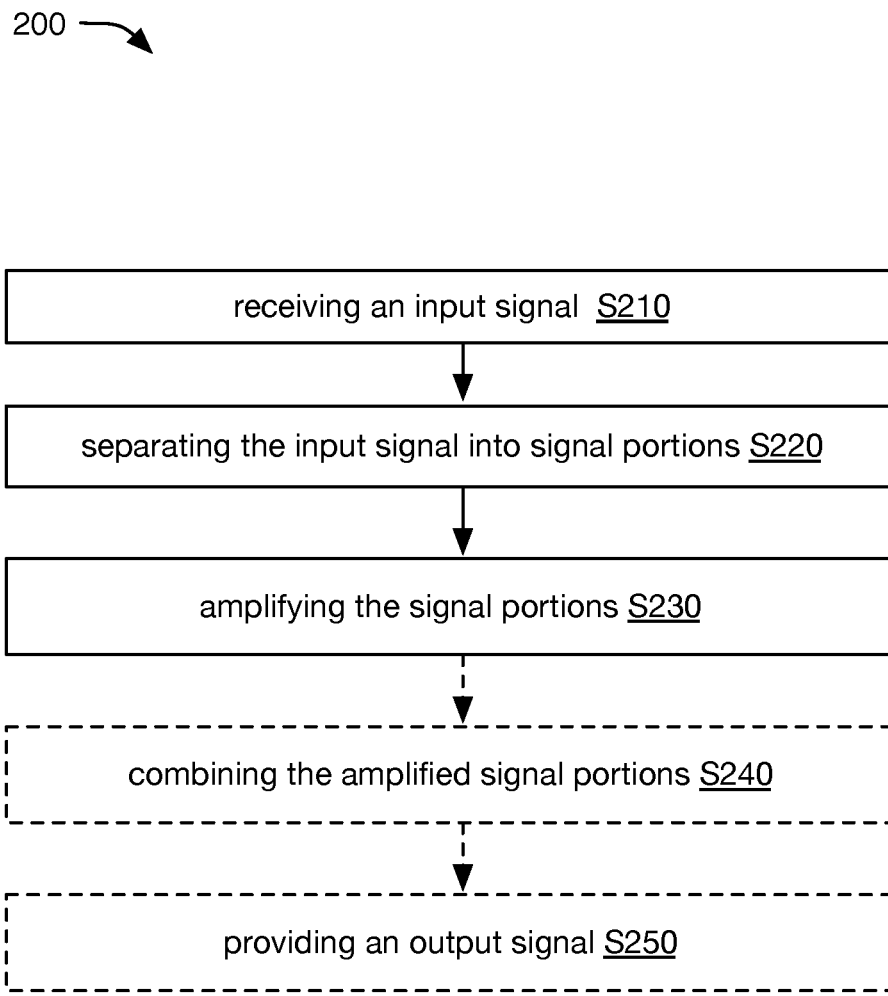
FIG. 10 is a diagram view of a method of an invention embodiment.

A method 200 for split-frequency amplification preferably includes receiving an input signal S210, separating the input signal into signal portions S220, and/or amplifying the signal portions S230 (e.g., as shown in FIG. 10). The method 200 can optionally include combining the amplified signal portions S240 and/or providing an output signal S250. The method 200 is preferably performed using the system 100 described above (e.g., performed as described regarding the functionality of the system 100 and/or elements thereof), but can additionally or alternatively be performed with any other suitable system.

S210 preferably includes receiving the input signal at a signal coupler (e.g., input coupler). The input signal can be a differential signal, single-ended signal, and/or can have any other suitable signal representation. However, S210 can additionally or alternatively include receiving any other suitable input signal in any suitable manner.

S220 preferably includes separating the signal based on frequency. This separation can be achieved by one or more filters (e.g., high-pass, low-pass, and/or band-pass filters), such as wherein a low-frequency portion of the signal will not propagate through a portion of the system that is filtered by a high-pass filter and/or a high-frequency portion of the signal will not propagate through a portion of the system that is filtered by a low-pass filter. The separation can additionally or alternatively be achieved by the intrinsic response characteristics of one or more elements of the system (e.g., characteristics of the amplification stages). For example, if a system includes a first branch with a high-bandwidth amplifier and a second branch with a low-bandwidth amplifier, most of the gain at higher-frequencies (e.g., above the bandwidth of the second branch amplifier) will be produced by the first branch amplifier, even in the absence of a low-pass filter on the second branch. The signal portions can be frequency bands such as described above regarding the system 100, and/or can include any other suitable portions of the signal. The signal portions can be separated such as described above regarding the system 100, and/or can be separated in any other suitable manner.

S230 preferably include providing the signal portions to different amplification elements. For example, each signal portion can propagate through one of a set of amplification stages (e.g., each on a different parallel branch, such as described above regarding the system 100), and can be amplified by the stage through which it propagates. Amplifying different portions using different amplification stages (e.g., with different gain and/or noise characteristics) can function to achiever superior performance across a broad band of frequencies than could be achieved with a unified amplification approach (e.g., as described above regarding the system 100). However, S230 can additionally or alternatively include amplifying the signal portions in any other suitable manner.

S240 preferably includes combining the signals from the different parallel branches after they are amplified. S240 preferably includes merging the signals at a signal coupler (e.g., output coupler). The merged signal can be a differential signal, single-ended signal, and/or can have any other suitable signal representation. S240 preferably includes merging signals from all the parallel branches into a single signal, but can additionally or alternatively include merging only a subset of the signals, merging different subsets into different partially-combined signals, and/or merging any other suitable signals. However, S240 can additionally or alternatively include combining the amplified signal portions in any other suitable manner.

S250 preferably includes providing the combined signal (e.g., merged in S240) as an output. S250 can additionally or alternatively include providing one or more uncombined and/or partially-combined signals as outputs, and/or can include providing any other suitable output signals.

However, the method 200 can additionally or alternatively include any other suitable elements performed in any suitable manner.

An alternative embodiment preferably implements the some or all of above methods in a computer-readable medium storing computer-readable instructions. The instructions are preferably executed by computer-executable components preferably integrated with a communication routing system. The communication routing system may include a communication system, routing system and a pricing system. The computer-readable medium may be stored on any suitable computer readable media such as RAMs, ROMs, flash memory, EEPROMs, optical devices (CD or DVD), hard drives, floppy drives, or any suitable device. The computer-executable component is preferably a processor but the instructions may alternatively or additionally be executed by any suitable dedicated hardware device.

Although omitted for conciseness, embodiments of the system and/or method can include every combination and permutation of the various system components and the various method processes, wherein one or more instances of the method and/or processes described herein can be performed asynchronously (e.g., sequentially), concurrently (e.g., in parallel), or in any other suitable order by and/or using one or more instances of the systems, elements, and/or entities described herein.

The FIGURES illustrate the architecture, functionality and operation of possible implementations of systems, methods and computer program products according to preferred embodiments, example configurations, and variations thereof. In this regard, each block in the flowchart or block diagrams may represent a module, segment, step, or portion of code, which comprises one or more executable instructions for implementing the specified logical function(s). It should also be noted that, in some alternative implementations, the functions noted in the block can occur out of the order noted in the FIGURES. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

As a person skilled in the art will recognize from the previous detailed description and from the figures and claims, modifications and changes can be made to the preferred embodiments of the invention without departing from the scope of this invention defined in the following claims.

We claim:

1. A system for split-frequency amplification, comprising:
a plurality of circuit branches, the plurality comprising a first branch and a second branch;
an input coupler that:
receives an input signal comprising a first band and a second band; and
couples a respective portion of the input signal onto each circuit branch of the plurality; and
an output coupler that:
receives a plurality of output signals from the plurality of circuit branches; and
combines the plurality of output signals into an output signal;
wherein:
the first band comprises a first frequency and does not comprise a second frequency lower than the first frequency;
the second band comprises the second frequency and does not comprise the first frequency;
the first branch comprises:
a first high-pass filter (HPF) defining a first cutoff frequency between the first and second frequencies; and
a first amplifier stage coupled to the first HPF, wherein the first amplifier stage receives a first portion of the input signal and amplifies the first portion into a first amplified signal of the plurality of amplified signals;
the second branch receives a second portion of the input signal and generates, based on the second portion of the input signal, a second output signal of the plurality of output signals, wherein the second portion exhibits a different spectral characteristic than the first portion; and
the second branch is electrically connected in parallel with the first branch between the input coupler and the output coupler.

2. The system of claim 1, further comprising a second amplifier stage on the second branch, wherein:
the second amplifier stage receives the second portion of the input signal and amplifies the second portion into the second output signal;
the first amplifier stage exhibits a first spectral response; and
the second amplifier stage exhibits a second spectral response substantially different from the first spectral response.

3. The system of claim 2, wherein:
the first amplifier stage exhibits a first high-frequency gain at the first frequency;
the second amplifier stage exhibits a second low-frequency gain at the second frequency; and
the second amplifier stage exhibits a second high-frequency gain at the first frequency, wherein the second high-frequency gain is substantially less than the first high-frequency gain and is substantially less than the second low-frequency gain.

4. The system of claim 3, wherein the second high-frequency gain is less than the second low-frequency gain by more than 6 dB.

5. The system of claim 1, wherein the second branch comprises a first low-pass filter (LPF) defining a second cutoff frequency between the first and second frequencies.

6. The system of claim 5, wherein the second cutoff frequency is substantially greater than the first cutoff frequency.

7. The system of claim 6, further comprising a second amplifier stage on the second branch, wherein:
the second amplifier stage receives the second portion of the input signal and amplifies the second portion into the second output signal;
the first amplifier stage exhibits a first spectral response; and
the second amplifier stage exhibits a second spectral response substantially different from the first spectral response.

8. The system of claim 1, wherein the first amplifier stage receives the first portion of the input signal from the first HPF.

9. A system for split-frequency amplification, comprising:
a plurality of circuit branches, the plurality comprising a first branch and a second branch;
an input coupler that:
receives an input signal comprising a first band and a second band; and
couples a respective portion of the input signal onto each circuit branch of the plurality, the input signal; and
an output coupler that:
receives a plurality of output signals from the plurality of circuit branches; and
combines the plurality of output signals into an output signal;
wherein:
the first band comprises a first frequency and does not comprise a second frequency;
the second band comprises the second frequency and does not comprise the first frequency;
the first branch comprises:
a first filter defining a first cutoff frequency between the first and second frequencies; and
a first amplifier stage coupled to the first filter, wherein the first amplifier stage receives a first portion of the input signal and amplifies the first portion into a first amplified signal of the plurality of amplified signals;
the second branch receives a second portion of the input signal and generates, based on the second portion of the input signal, a second output signal of the plurality of output signals, wherein the second portion exhibits a different spectral characteristic than the first portion; and
the second branch is electrically connected in parallel with the first branch between the input coupler and the output coupler.

10. The system of claim 9, wherein the second branch comprises a second filter defining a second cutoff frequency between the first and second frequencies.

11. The system of claim 10, wherein the second cutoff frequency is substantially different from the first cutoff frequency.

12. The system of claim 9, further comprising a second amplifier stage on the second branch, wherein:
the second amplifier stage receives the second portion of the input signal and amplifies the second portion into the second output signal;
the first amplifier stage exhibits a first spectral response; and
the second amplifier stage exhibits a second spectral response substantially different from the first spectral response.

13. The system of claim 12, wherein the plurality of circuit branches further comprises a third branch, the third branch comprising a third amplifier stage that receives a third portion of the input signal and amplifies the third portion into a third output signal of the plurality of output signals.

14. The system of claim 9, wherein:
the second frequency is lower than the first frequency; and
the first filter comprises a first high-pass filter (HPF).

15. The system of claim 9, wherein the first amplifier stage receives the first portion of the input signal from the first filter.

16. A method for split-frequency amplification, comprising:
receiving an input signal comprising a first band and a second band;
separating the input signal into a plurality of signal portions comprising a first portion and a second portion;
at a first filter, spectrally filtering the first portion such that a second band intensity of the second band within the first portion is reduced relative to a first band intensity of the first band within the first portion;
at a first amplifier, amplifying the first portion;
at a second amplifier separate from the first amplifier, amplifying the second portion; and
after spectrally filtering the first portion and amplifying the first and second portions, combining the plurality of signal portions into an output signal.

17. The method of claim 16, wherein:
the first band comprises a first frequency and does not comprise a second frequency lower than the first frequency;
the second band comprises the second frequency and does not comprise the first frequency; and
the first filter comprises a high-pass filter (HPF) defining a first cutoff frequency between the first and second frequencies.

18. The method of claim 17, wherein:
the first amplifier exhibits a first high-frequency gain at the first frequency;
the second amplifier exhibits a second low-frequency gain at the second frequency; and
the second amplifier exhibits a second high-frequency gain at the first frequency, wherein the second high-frequency gain is substantially less than the first high-frequency gain and is substantially less than the second low-frequency gain.

19. The method of claim 18, wherein:
the first amplifier comprises an MOS-based amplifier stage; and
the second amplifier comprises a BJT-based amplifier stage.

20. The method of claim 16, wherein:
the first amplifier exhibits a first noise power in the first band and exhibits a second noise power in the second band; and
the second amplifier exhibits a third noise power, greater than the first noise power, in the first band and exhibits a fourth noise power, lesser than the second noise power, in the second band.

21. The method of claim 16, wherein the first filter spectrally filters the first portion before the first amplifier amplifies the first portion.

\* \* \* \* \*